US012674837B2

(12) United States Patent
Ramachandran et al.

(10) Patent No.: US 12,674,837 B2
(45) Date of Patent: Jul. 7, 2026

(54) METHOD AND APPARATUS FOR TESTING ELECTRONIC DEVICES

(71) Applicant: International Controls and Measurements Corporation, North Syracuse, NY (US)

(72) Inventors: Hemanth Ramachandran, Liverpool, NY (US); Anish Donald, Liverpool, NY (US); Weidong Pan, Morganville, NJ (US)

(73) Assignee: International Controls and Measurements Corporation, North Syracuse, NY (US)

( * ) Notice: Subject to any disclaimer, the term of this patent is extended or adjusted under 35 U.S.C. 154(b) by 174 days.

(21) Appl. No.: 18/833,888

(22) PCT Filed: Jan. 27, 2023

(86) PCT No.: PCT/US2023/061458
§ 371 (c)(1),
(2) Date: Jul. 27, 2024

(87) PCT Pub. No.: WO2023/147475
PCT Pub. Date: Aug. 3, 2023

(65) Prior Publication Data
US 2025/0102561 A1 Mar. 27, 2025

Related U.S. Application Data

(60) Provisional application No. 63/267,244, filed on Jan. 28, 2022.

(51) Int. Cl.
*G01R 31/28* (2006.01)
*G01R 31/14* (2006.01)

(52) U.S. Cl.
CPC ......... *G01R 31/2832* (2013.01); *G01R 31/14* (2013.01)

(58) Field of Classification Search
None
See application file for complete search history.

(56) References Cited

U.S. PATENT DOCUMENTS 6,054,865 A    4/2000  Bald et al.
10,126,328 B1 *  11/2018  Parkes ................ G01R 1/0416
(Continued)

OTHER PUBLICATIONS

International Search Report and Written Opinion of the International Searching Authority from a corresponding International patent application (PCT/US2023/061458) bearing a mailing date of Dec. 14, 2023.

(Continued)

*Primary Examiner* — Farhana A Hoque
(74) *Attorney, Agent, or Firm* — Brown & Brown IP Law PLLC

(57) ABSTRACT

Integrated test fixtures, universal test fixtures, integrated test systems, and method for testing electronic devices. In some aspects, an integrated test fixture is configured to perform both Hi-pot testing and functional testing on a unit-under-test, i.e., while the unit-under-test remains in place in the test fixture. In some aspects, a universal test fixture comprises a processor and/or a non-transitory tangible medium that is configured to provide instructions to carry out such testing. Also, methods of testing.

23 Claims, 30 Drawing Sheets

(56)                      References Cited

U.S. PATENT DOCUMENTS

| | | |
|---|---|---|
| 2001/0052778 A1 | 12/2001 | Smith |
| 2004/0183524 A1 | 9/2004 | Braun et al. |
| 2014/0266233 A1 | 9/2014 | Brower |

OTHER PUBLICATIONS

International_Preliminary_Report_on_Patentability of the International Searching Authority from a corresponding International patent application (PCT/US2023/061458) bearing a mailing date of Aug. 8, 2024.

* cited by examiner

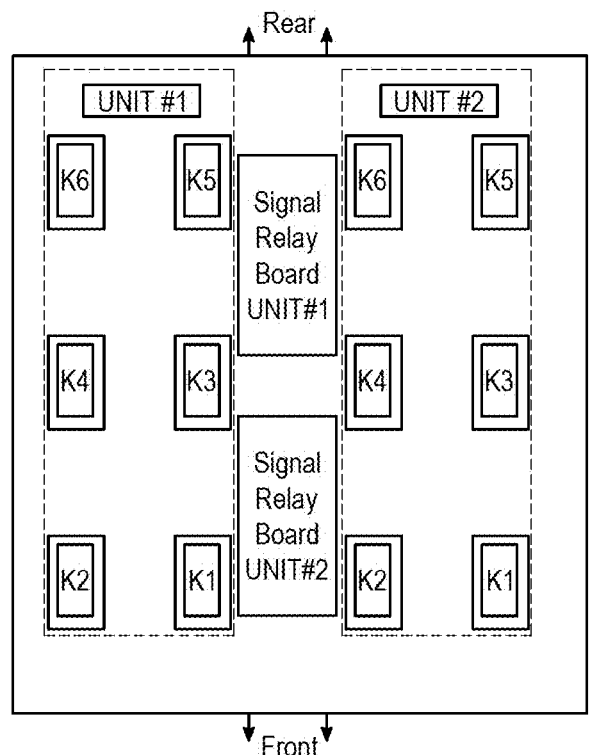
Control Relay/Socket Info
.For K1 thru K6 relay use : TE MT326115
.For relay sockets use: TE MT78760
.For signal relay boards use: UTF0004
(PCB1660-2A)
Relay/Socket Pin-Out
| Pole # | COM | N.O. | N.C. |
|--------|-----|------|------|
| 1 | 11 | 14 | 12 |
| 2 | 21 | 24 | 22 |
| 3 | 31 | 34 | 32 |
Coil: A1(2) and A2(10)
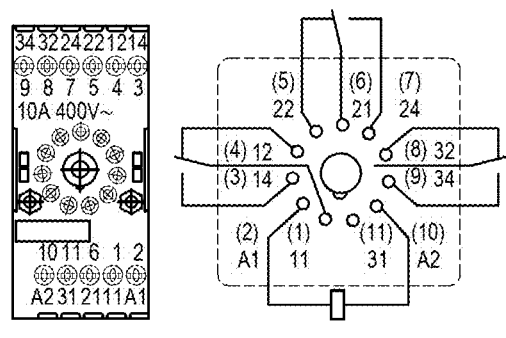
FIG. 9

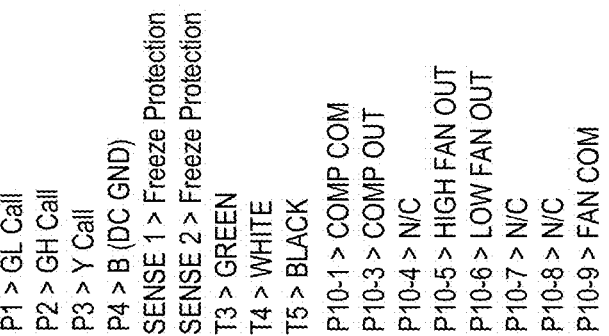
P1 > GL Call
P2 > GH Call
P3 > Y Call
P4 > B (DC GND)
SENSE 1 > Freeze Protection
SENSE 2 > Freeze Protection
T3 > GREEN
T4 > WHITE
T5 > BLACK
P10-1 > COMP COM
P10-3 > COMP OUT
P10-4 > N/C
P10-5 > HIGH FAN OUT
P10-6 > LOW FAN OUT
P10-7 > N/C
P10-8 > N/C
P10-9 > FAN COM
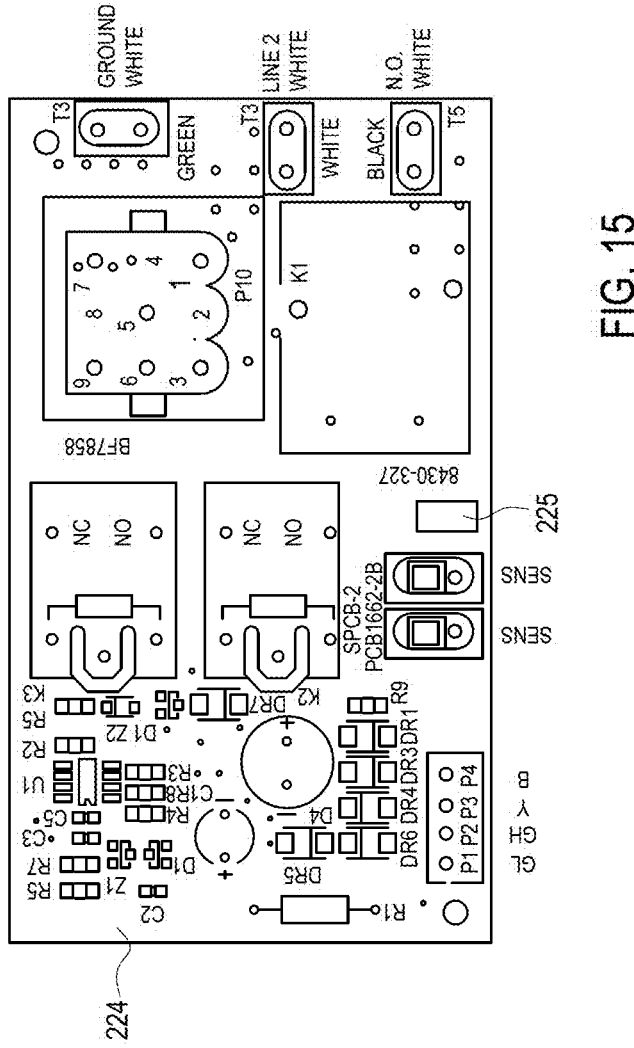
FIG. 15

Tower #1 J1: Relay 01 Card

| Fixture Relay Terminal | | |
|---|---|---|
| K1 N.O. | | |
| K1 N.O. | 49 | Scanner Trigger |
| K1 Comm. | 16 | Scanner Trigger |
| K1 Comm. | | |
| K2 N.O. | | |
| K2 N.O. | 15 | No Connection |
| K2 Comm. | | |
| K2 Comm. | 47 | |
| K3 N.O. | 14 | Unit #1 Control Relay K1 coil |
| K3 N.O. | | |
| K3 Comm. | 46 | Unit #1 120VAC Fused |
| K3 Comm. | | |
| K4 N.O. | | |
| K4 N.O. | 45 | No Connection |
| K4 Comm. | 12 | |
| K4 Comm. | | |
| K5 N.O. | | |
| K5 N.O. | 11 | Unit #1 Control Relay K2 coil |
| K5 Comm. | | |
| K5 Comm. | 43 | Unit #1 120VAC Fused |
| K6 N.O. | 10 | Unit #1 Control Relay K3 coil |
| K6 N.O. | | |
| K6 Comm. | 42 | Unit #1 120VAC Fused |
| K6 Comm. | | |
| K7 N.O. | | |
| K7 N.O. | 41 | Unit #1 Control Relay K4 coil |
| K7 Comm. | 8 | Unit #1 120VAC Fused |
| K7 Comm. | | |
| K8 N.O. | | |
| K8 N.O. | 7 | Unit #1 Control Relay K4 coil |
| K8 Comm. | | |
| K8 Comm. | 39 | Unit #1 120VAC Fused |

FIG. 17A

| Fixture Relay Terminal | | |
|---|---|---|
| K9 N.O. | 6 | Unit #1 Control Relay K6 coil |
| K9 N.O. | | |
| K9 Comm. | 36 | Unit #1 120VAC Fused |
| K9 Comm. | | |
| K10 N.O. | | No Connection |
| K10 N.O. | 37 | |
| K10 Comm. | 4 | |
| K10 Comm. | | |
| K11 N.O. | | |
| K11 N.O. | 3 | Hi-pot #1 Trigger. Input D-Sub Pin #3 |
| K11 Comm. | | |
| K11 Comm. | 35 | Hi-pot #1 Trigger. Input D-Sub Pin #5 |
| K12 N.O. | 2 | Hi-pot #1 Reset. Input D-Sub Pin #2 |
| K12 N.O. | | |
| K12 Comm. | 34 | Hi-pot #1 Reset. Input D-Sub Pin #5 |
| K12 Comm. | | |

| FS | 50 |
|---|---|
| FS | |

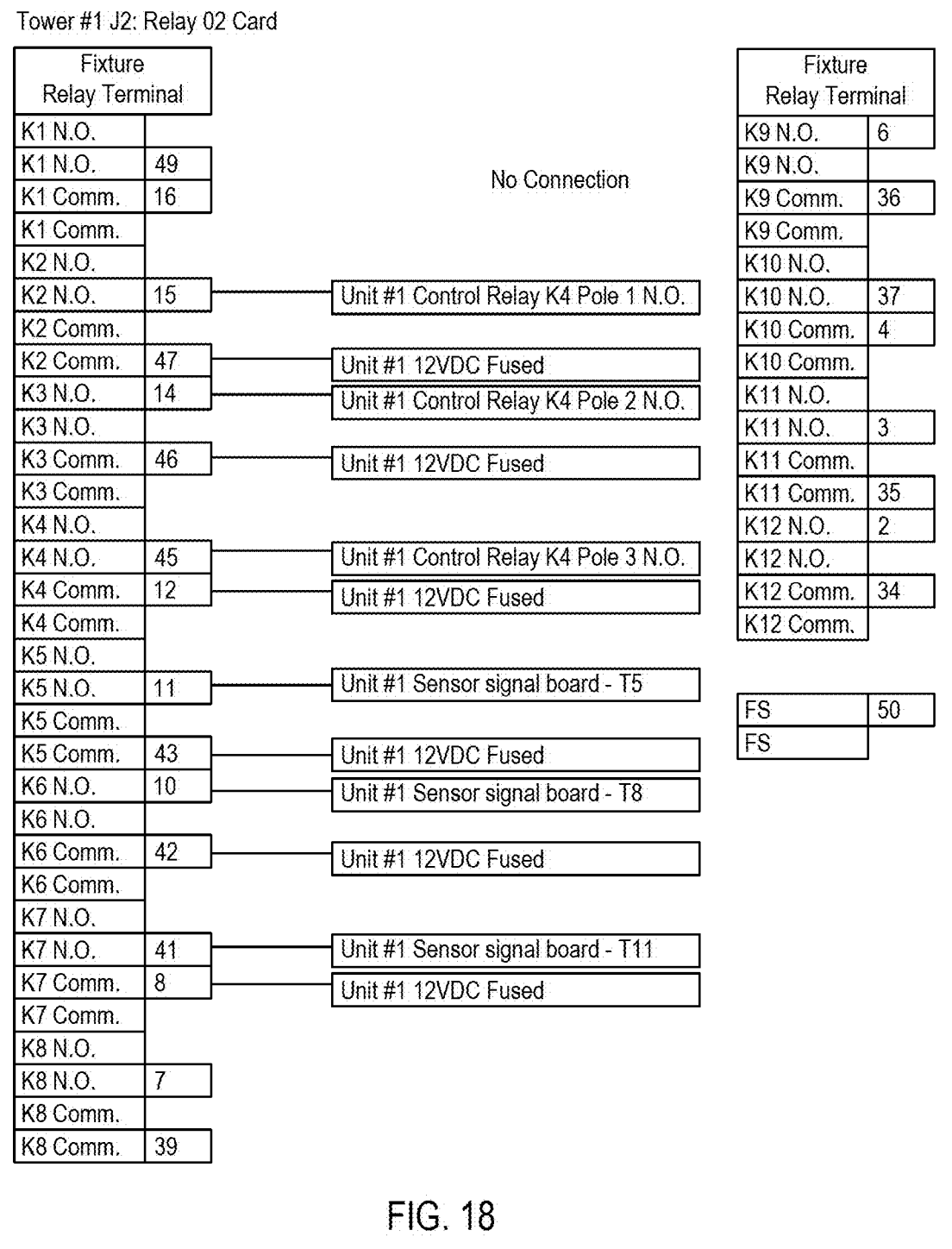

Tower #1 J2: Relay 02 Card

| Fixture Relay Terminal | |
|---|---|
| K1 N.O. | |
| K1 N.O. | 49 |
| K1 Comm. | 16 |
| K1 Comm. | |
| K2 N.O. | |
| K2 N.O. | 15 |
| K2 Comm. | |
| K2 Comm. | 47 |
| K3 N.O. | 14 |
| K3 N.O. | |
| K3 Comm. | 46 |
| K3 Comm. | |
| K4 N.O. | |
| K4 N.O. | 45 |
| K4 Comm. | 12 |
| K4 Comm. | |
| K5 N.O. | |
| K5 N.O. | 11 |
| K5 Comm. | |
| K5 Comm. | 43 |
| K6 N.O. | 10 |
| K6 N.O. | |
| K6 Comm. | 42 |
| K6 Comm. | |
| K7 N.O. | |
| K7 N.O. | 41 |
| K7 Comm. | 8 |
| K7 Comm. | |
| K8 N.O. | |
| K8 N.O. | 7 |
| K8 Comm. | |
| K8 Comm. | 39 |

No Connection

Unit #1 Control Relay K4 Pole 1 N.O.

Unit #1 12VDC Fused
Unit #1 Control Relay K4 Pole 2 N.O.

Unit #1 12VDC Fused

Unit #1 Control Relay K4 Pole 3 N.O.
Unit #1 12VDC Fused

Unit #1 Sensor signal board - T5

Unit #1 12VDC Fused
Unit #1 Sensor signal board - T8

Unit #1 12VDC Fused

Unit #1 Sensor signal board - T11
Unit #1 12VDC Fused

| Fixture Relay Terminal | |
|---|---|
| K9 N.O. | 6 |
| K9 N.O. | |
| K9 Comm. | 36 |
| K9 Comm. | |
| K10 N.O. | |
| K10 N.O. | 37 |
| K10 Comm. | 4 |
| K10 Comm. | |
| K11 N.O. | |
| K11 N.O. | 3 |
| K11 Comm. | |
| K11 Comm. | 35 |
| K12 N.O. | 2 |
| K12 N.O. | |
| K12 Comm. | 34 |
| K12 Comm. | |

| FS | 50 |
|---|---|
| FS | |

FIG. 18

Tower #1 J3: ACR 01 Card

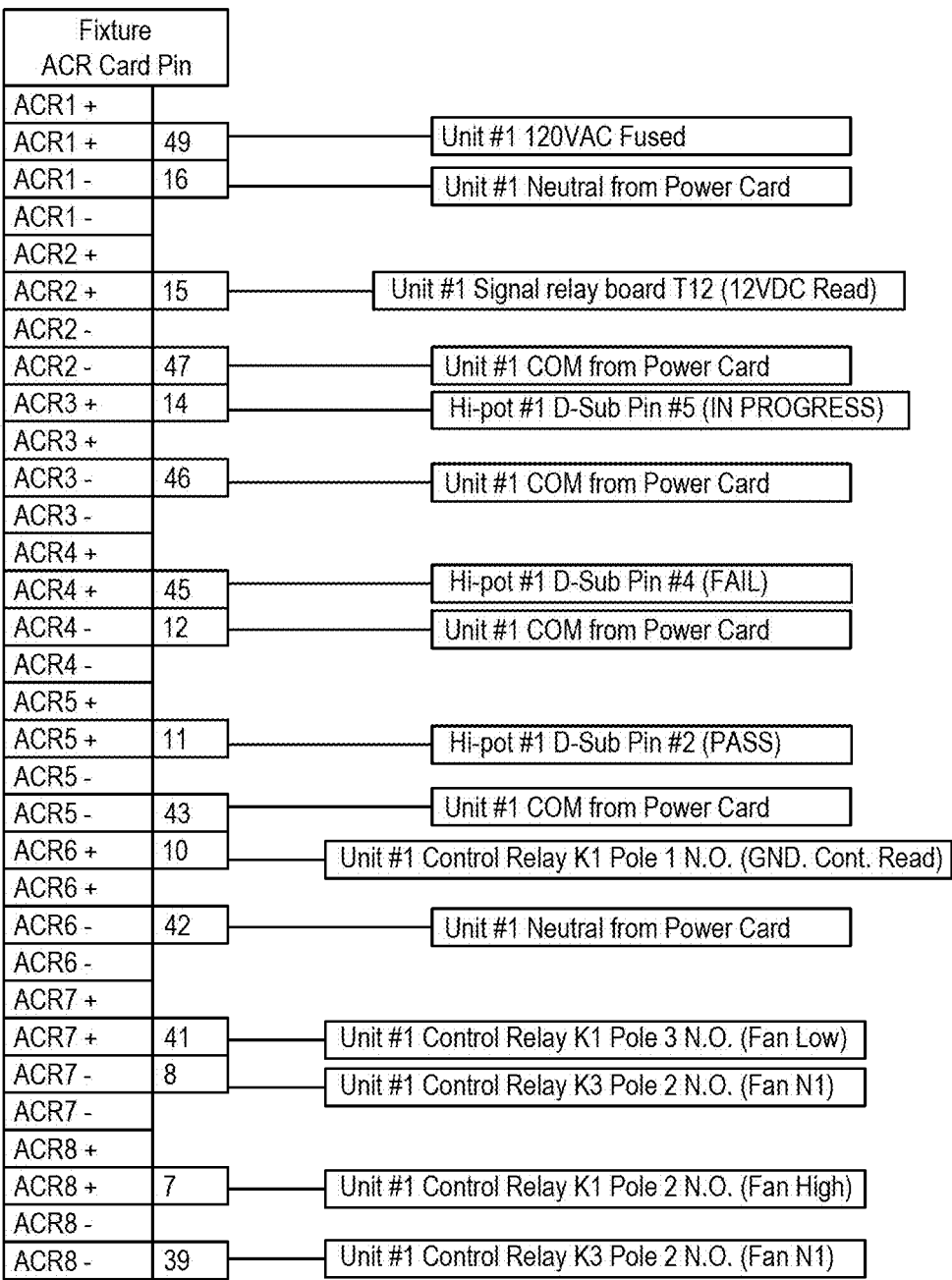

| Fixture ACR Card Pin | | |
|---|---|---|
| ACR1 + | | |
| ACR1 + | 49 | Unit #1 120VAC Fused |
| ACR1 - | 16 | Unit #1 Neutral from Power Card |
| ACR1 - | | |
| ACR2 + | | |
| ACR2 + | 15 | Unit #1 Signal relay board T12 (12VDC Read) |
| ACR2 - | | |
| ACR2 - | 47 | Unit #1 COM from Power Card |
| ACR3 + | 14 | Hi-pot #1 D-Sub Pin #5 (IN PROGRESS) |
| ACR3 + | | |
| ACR3 - | 46 | Unit #1 COM from Power Card |
| ACR3 - | | |
| ACR4 + | | |
| ACR4 + | 45 | Hi-pot #1 D-Sub Pin #4 (FAIL) |
| ACR4 - | 12 | Unit #1 COM from Power Card |
| ACR4 - | | |
| ACR5 + | | |
| ACR5 + | 11 | Hi-pot #1 D-Sub Pin #2 (PASS) |
| ACR5 - | | |
| ACR5 - | 43 | Unit #1 COM from Power Card |
| ACR6 + | 10 | Unit #1 Control Relay K1 Pole 1 N.O. (GND. Cont. Read) |
| ACR6 + | | |
| ACR6 - | 42 | Unit #1 Neutral from Power Card |
| ACR6 - | | |
| ACR7 + | | |
| ACR7 + | 41 | Unit #1 Control Relay K1 Pole 3 N.O. (Fan Low) |
| ACR7 - | 8 | Unit #1 Control Relay K3 Pole 2 N.O. (Fan N1) |
| ACR7 - | | |
| ACR8 + | | |
| ACR8 + | 7 | Unit #1 Control Relay K1 Pole 2 N.O. (Fan High) |
| ACR8 - | | |
| ACR8 - | 39 | Unit #1 Control Relay K3 Pole 2 N.O. (Fan N1) |

FIG. 19A

| Fixture Relay Terminal | | |
|---|---|---|
| ACR9 + | 6 | Unit #1 Control Relay K2 Pole 1 N.O. (Comp Read) |
| ACR9 + | | |
| ACR9 - | 38 | Unit #1 Control Relay K3 Pole 3 N.O. (Comp N2) |
| ACR9 - | | |
| ACR10 + | | |
| ACR10 + | 37 | Unit #1 24VAC Fused |
| ACR10 - | 4 | Unit #1 COM from Power Card |
| ACR10 - | | |
| ACR11 + | | |
| ACR11 + | 3 | Hi-pot #1 - Hi-pot Line Voltage Fused |
| ACR11 - | | |
| ACR11 - | 35 | Hi-pot #1 - Neutral from Hi-pot power cord |
| ACR12 + | 2 | |
| ACR12 + | | |
| ACR12 - | 34 | |
| ACR12 - | | |

| Power Card PCB Label | Tower PWR Pin Out | | Fixture PWR Pin Out | |
|---|---|---|---|---|
| | INT 12VDC RTN | 1 | INT 12VDC RTN | 1 |
| | INT 12VDC RTN | 14 | INT 12VDC RTN | 14 |
| | INT 12VDC | 2 | INT 12VDC | 2 |
| | INT 12VDC | 15 | INT 12VDC | 15 |

Wire Color: Brown
18/20 AWG, 2.3 Max Amp — SEC_21 SEC_22

| | 24VAC RTN | 4 | 24VAC RTN | 4 |
|---|---|---|---|---|
| | 24VAC RTN | 5 | 24VAC RTN | 5 |
| | 24VAC RTN | 16 | 24VAC RTN | 16 |
| | 24VAC RTN | 17 | 24VAC RTN | 17 |

Wire Color: Red
18/20 AWG, 2.3 Max Amp — SEC_11

| | 24VAC RTN | 6 | 24VAC RTN | 6 |
|---|---|---|---|---|
| | 24VAC RTN | 7 | 24VAC RTN | 7 |
| | 24VAC RTN | 18 | 24VAC RTN | 18 |
| | 24VAC RTN | 19 | 24VAC RTN | 19 |

Wire Color: White
18/20 AWG, 2.3 Max Amp — N1, N2, N3, N4

| | 120VAC RTN | 9 | 120VAC RTN | 9 |
|---|---|---|---|---|
| | 120VAC RTN | 10 | 120VAC RTN | 10 |
| | 120VAC RTN | 21 | 120VAC RTN | 21 |
| | 120VAC RTN | 22 | 120VAC RTN | 22 |

Wire Color: Black
18/20 AWG, 2.3 Max Amp — L1, L1_

| | 120VAC | 12 | 120VAC | 12 |
|---|---|---|---|---|
| | 120VAC | 13 | 120VAC | 13 |
| | 120VAC | 24 | 120VAC | 24 |
| | 120VAC | 25 | 120VAC | 25 |

Chassis Ground Wire between
Chassis and SEC_22
Wire Color: Green
18/20 AWG, 2.3 Max Amp

| | 12VDC | 3 | 12VDC | 3 |
|---|---|---|---|---|
| | GND | 8 | GND | 8 |

FIG. 20A

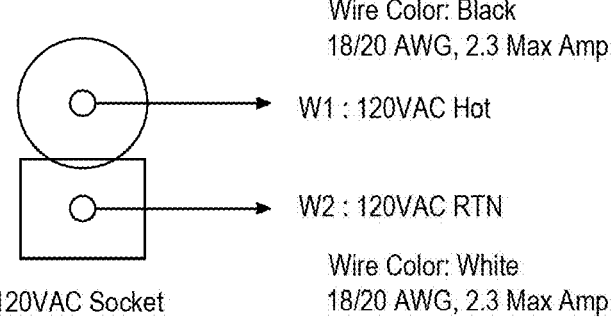
Wire Color: Black
18/20 AWG, 2.3 Max Amp
W1 : 120VAC Hot
W2 : 120VAC RTN
Wire Color: White
18/20 AWG, 2.3 Max Amp
120VAC Socket
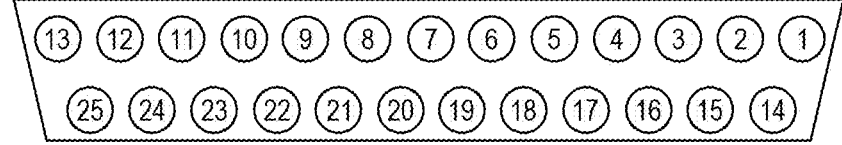
12, 13, 24, 25: 120VAC (L1)     6, 7, 18, 19: 24VAC     2, 15: 12VDC Interlock
9, 10, 21, 22: 120VAC TRN (N1)     4, 5, 16, 17: 24VAC RTN     1, 14: 12VDC RTN Interlock
3: 12VDC PWR
8: DC PWR GND
FIG. 20B

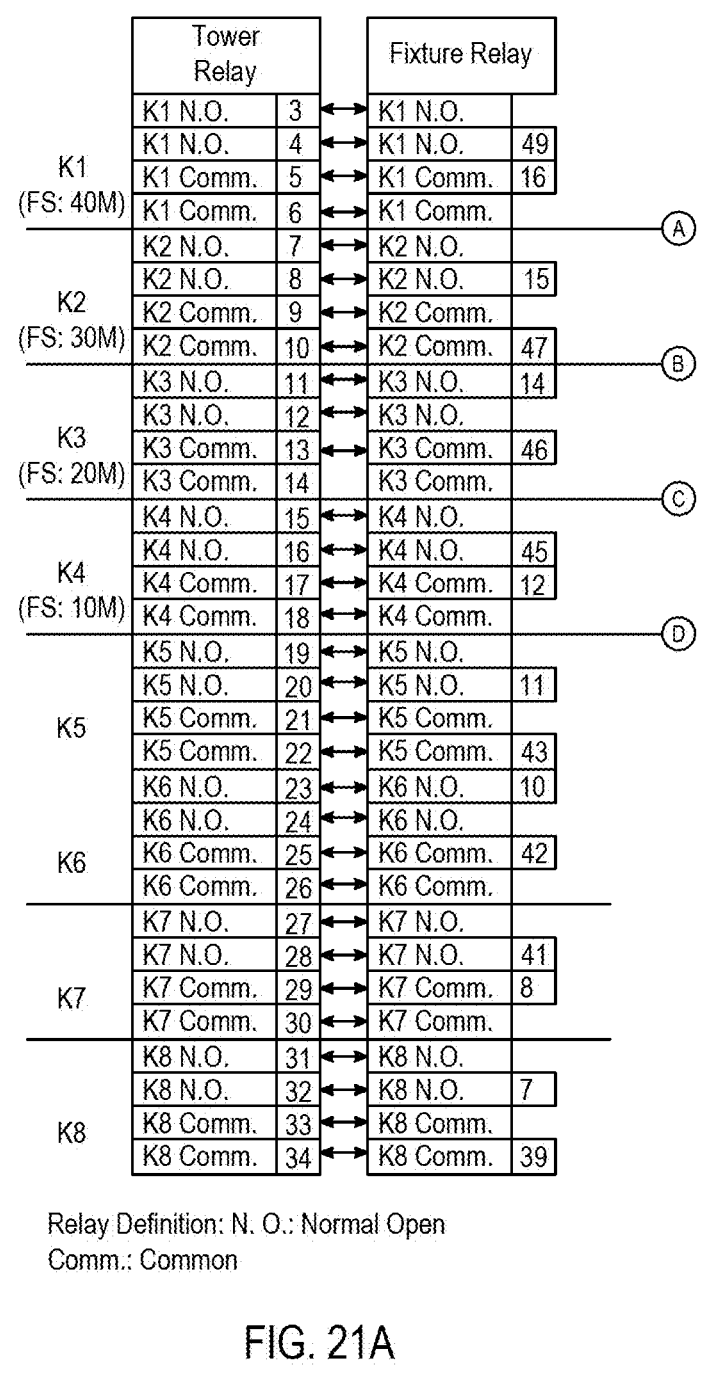

| | Tower Relay | | | Fixture Relay | |
|---|---|---|---|---|---|
| K1 (FS: 40M) | K1 N.O. | 3 | ↔ | K1 N.O. | |
| | K1 N.O. | 4 | ↔ | K1 N.O. | 49 |
| | K1 Comm. | 5 | ↔ | K1 Comm. | 16 |
| | K1 Comm. | 6 | ↔ | K1 Comm. | Ⓐ |
| K2 (FS: 30M) | K2 N.O. | 7 | ↔ | K2 N.O. | |
| | K2 N.O. | 8 | ↔ | K2 N.O. | 15 |
| | K2 Comm. | 9 | ↔ | K2 Comm. | |
| | K2 Comm. | 10 | ↔ | K2 Comm. | 47 Ⓑ |
| K3 (FS: 20M) | K3 N.O. | 11 | ↔ | K3 N.O. | 14 |
| | K3 N.O. | 12 | ↔ | K3 N.O. | |
| | K3 Comm. | 13 | ↔ | K3 Comm. | 46 |
| | K3 Comm. | 14 | | K3 Comm. | Ⓒ |
| K4 (FS: 10M) | K4 N.O. | 15 | ↔ | K4 N.O. | |
| | K4 N.O. | 16 | ↔ | K4 N.O. | 45 |
| | K4 Comm. | 17 | ↔ | K4 Comm. | 12 |
| | K4 Comm. | 18 | ↔ | K4 Comm. | Ⓓ |
| K5 | K5 N.O. | 19 | ↔ | K5 N.O. | |
| | K5 N.O. | 20 | ↔ | K5 N.O. | 11 |
| | K5 Comm. | 21 | ↔ | K5 Comm. | |
| | K5 Comm. | 22 | ↔ | K5 Comm. | 43 |
| K6 | K6 N.O. | 23 | ↔ | K6 N.O. | 10 |
| | K6 N.O. | 24 | ↔ | K6 N.O. | |
| | K6 Comm. | 25 | ↔ | K6 Comm. | 42 |
| | K6 Comm. | 26 | ↔ | K6 Comm. | |
| K7 | K7 N.O. | 27 | ↔ | K7 N.O. | |
| | K7 N.O. | 28 | ↔ | K7 N.O. | 41 |
| | K7 Comm. | 29 | ↔ | K7 Comm. | 8 |
| | K7 Comm. | 30 | ↔ | K7 Comm. | |
| K8 | K8 N.O. | 31 | ↔ | K8 N.O. | |
| | K8 N.O. | 32 | ↔ | K8 N.O. | 7 |
| | K8 Comm. | 33 | ↔ | K8 Comm. | |
| | K8 Comm. | 34 | ↔ | K8 Comm. | 39 |

Relay Definition: N. O.: Normal Open
Comm.: Common

FIG. 21A

| Tower Relay | | | | Fixture Relay | |
|---|---|---|---|---|---|
| K9 N.O. | 35 | ←→ | K9 N.O. | 6 |
| K9 N.O. | 36 | ←→ | K9 N.O. | |
| K9 Comm. | 37 | ←→ | K9 Comm. | 38 |
| K9 Comm. | 38 | ←→ | K9 Comm. | |
| K10 N.O. | 39 | ←→ | K10 N.O. | |
| K10 N.O. | 40 | ←→ | K10 N.O. | 37 |
| K10 Comm. | 41 | ←→ | K10 Comm. | 4 |
| K10 Comm. | 42 | ←→ | K10 Comm. | |
| K11 N.O. | 43 | ←→ | K11 N.O. | |
| K11 N.O. | 44 | ←→ | K11 N.O. | 3 |
| K11 Comm. | 45 | ←→ | K11 Comm. | |
| K11 Comm. | 46 | ←→ | K11 Comm. | 35 |
| K12 N.O. | 47 | ←→ | K12 N.O. | 2 |
| K12 N.O. | 48 | ←→ | K12 N.O. | |
| K12 Comm. | 49 | ←→ | K12 Comm. | 34 |
| K12 Comm. | 50 | ←→ | K12 Comm. | |

K9 — Ⓐ
K10 — Ⓑ
K11 — Ⓒ
K12 — Ⓓ

Flame Sense input

| K12 RTN | 1 | ←→ | FS | 50 |
|---|---|---|---|---|
| K12 RTN | 2 | ←→ | FS | |

The Rear Side of 50 Pin Fixture Terminal - Relay Card

15: K2 N.O.   45: K4 N.O.   10: K6 N.O.   7: K8 N.O.   37: K10 N.O.   2: K12 N.O.
47: K2 Comm. 12: K4 Comm. 42: K6 Comm. 39: K8 Comm. 4: K10 Comm. 34: K12 Comm.

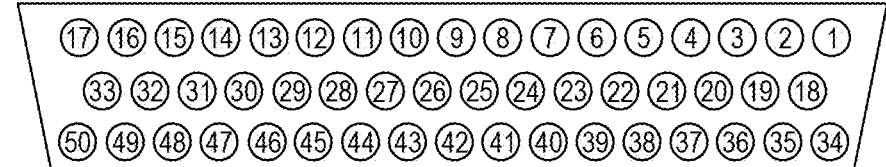

50. F.S.   49: K1 N.O.   14: K3 N.O.   11: K5 N.O.   41: K7 N.O.   6: K9 N.O.   3: K11 N.O.
16: K1 Comm. 46: K3 Comm. 43: K5 Comm. 8: K7 Comm. 38: K9 Comm. 35: K11 Comm.

FIG. 21 B

The 50 Pin Fixture Terminal

15: K2 N.O.    45: K4 N.O.    10: K6 N.O.    7: K8 N.O.    37: K10 N.O.    2: K12 N.O.
47: K2 Comm. 12: K4 Comm. 42: K6 Comm. 39: K8 Comm. 4: K10 Comm. 34: K12 Comm.

50. F.S.    49: K1 N.O.    14: K3 N.O.    11: K5 N.O.    6: K9 N.O.    3: K11 N.O.
16: K1 Comm. 46: K3 Comm. 43: K5 Comm. 8: K7 Comm. 38: K9 Comm. 35: K11 Comm.

The 50 Pin IDC Cable Connector

41: K2 Comm. 38: K4 Comm. 26: K6 Comm.  17: K8 Comm. 10: K10 Comm. 2: K12 Comm.
43: K2 N.O.    35: K4 N.O.    28: K6 N.O.    19: K8 N.O.    11: K10 N.O.    4: K12 N.O.

46: K1 Comm. 38: K3 Comm. 29: K5 Comm. 22: K7 Comm. 14: K9 Comm. 5: K11 Comm.
47: K1 N.O.    40: K3 N.O.    31: K5 N.O.    23: K7 N.O.    16: K9 N.O.    7: K11 N.O.

METHOD AND APPARATUS FOR TESTING ELECTRONIC DEVICES

CROSS-REFERENCE TO RELATED APPLICATIONS

This application claims priority of U.S. Provisional patent application Ser. No. 63/267,244, filed Jan. 28, 2022, the entirety of which is incorporated herein by reference.

FIELD OF THE INVENTION

The present invention relates to devices and methods for testing electronic devices.

BACKGROUND

As organizations and markets grow, they often run into a wall where internal processes struggle to keep up with continued demand. Many companies strive to solve problems in the quickest and/or the cheapest ways possible. Over time, doing so can lead companies unwittingly toward significant pitfalls, in some cases, among the most deleterious of pitfalls for a growing organization-coming to rely on multiple standalone applications and/or installations for each of a variety of functions in an ad hoc manner. As demand and complexity grow, these disparate systems can (and often do) create operational inefficiencies that can be detrimental to a company's bottom line, and can impede the company's ability to reach its full potential.

BRIEF SUMMARY OF THE INVENTION

This section (i.e., "Brief Summary of the Invention") presents a simplified summary of the present invention in order to provide a basic understanding of some aspects of the invention. Included in this section are some concepts of the invention as a prelude to more detailed descriptions of aspects of the present invention, and representative embodiments in accordance with aspects of the present invention.

Conventionally, production line testing incorporates standalone testers for Hi-pot and separate standalone testers for functional checking, to establish conformity to requirements. These two tests are performed on a product as separate operations, typically by two different operators, wherein each operation involves manual loading and unloading of units into and out of each of the test platforms.

The present invention provides apparatus and methods by which Hi-pot testing and functional testing are combined into a single test apparatus. The present invention also provides apparatus that is configured to control both Hi-pot testing and functional testing. The present invention also provides a single apparatus that can be used to perform both Hi-pot testing and functional testing, and that is configured to control performance of both Hi-pot testing and functional testing using the apparatus. The present invention also provides methods of performing such testing.

In some aspects of the present invention, there is provided an integrated test fixture in which:

a plurality of terminals are spatially arranged on a carrier so that they can be simultaneously brought into contact (so as to make electrical contact) with a plurality of respective contacts in a unit-under-test, a first group of the terminals can be electrically connected to each other (via a first group of respective relays), a second group of the terminals can likewise be electrically connected to each other (similarly via respective relays), and with the first and second groups of terminals in contact with the respective contacts on the unit-under-test, a high voltage can be applied across (1) the first group of terminals and (2) the second group of terminals, to perform Hi-pot testing on the unit-under-test (i.e., to see if any significant current flows between (i) the contacts in electrical contact with the first group of terminals and (ii) the contacts in electrical contact with the second group of terminals), and with the carrier still in place relative to the unit-under-test, by changing the position of one or more respective relays for each of the first and second groups of terminals, signals (electrical current) can be supplied to various components in the unit-under-test, and functional testing can be performed to verify that the unit-under-test reacts properly to the application of such signals.

In some aspects of the present invention, there is provided a universal test fixture (or "tower," e.g., a processor, such as a PC, that uses programmable logic control) that provides instructions to perform, sequentially:

Hi-pot testing on a unit-under-test by applying voltage across (1) a first group conductor electrically connected to a first group of terminals (via a first group of respective relays) and (2) a second group conductor electrically connected to a second group of terminals (via a second group of respective relays), and functional testing on the unit-under-test, such functional testing comprising one or more functional tests, each functional test being carried out by (1) applying a signal (current) to a first functional conductor (or by applying respective signals to two or more respective functional conductors) (the functional conductor(s) being distinct from the first group conductor and the second group conductor), the signal supplied to the first functional conductor reaching one of a second group of terminals via one of the relays in the second group relays (or the signals to respective functional conductors reaching respective terminals in the second group of terminals), by virtue of that second group relay (or respective second group relays) being changed in position relative to the position it was in (or they were in) during the Hi-pot test, to establish electrical connection between the first functional conductor and one of the terminals in the second group of terminals (or between the functional conductors and respective terminals in the second group of terminals), thereby supplying the signal (or signals) to a first contact (or respective contacts) on the unit-under-test, and (2) also changing the position of one of the first group of relays (relative to the position it was in during the Hi-pot test) to establish electrical connection between a second contact on the unit-under-test and a second functional conductor, which second contact-if the unit-under-test is operating properly-will exhibit an electrical condition in response to the signal suppled to the unit-under-test (or changing the respective positions of two or more of the first group of relays, relative to the positions they were in during the Hi-pot test) to establish electrical connection between two or more contacts on the unit-under-test, which contacts-if the unit-under-test is operating properly, will exhibit electrical conditions in response to the signal or signals supplied to the unit-under-test), to establish electrical connection between the second functional conductor and one of the terminals in the first group of terminals (or to establish electrical connection between the functional conductors and respective terminals in the first group of terminals), whereby the unit-under-test undergoes that functional test, such functional test determining whether the electrical condition (or conditions) that should result from the signal(s) being supplied are detected to have occurred.

In some aspects of the present invention, there is provided an integrated test fixture as described above that is controlled by a universal test fixture as described above.

In some aspects of the present invention, there is provided a method that comprises contacting terminals on a carrier with contacts on a unit-under-test, and controlling relays and applying electricity to sequentially perform both Hi-pot testing and functional testing while the terminals on the carrier are in electrical contact with the contacts on the unit-under-test.

In a first aspect of the present invention, there is provided an integrated test fixture, comprising:

a carrier,
a plurality of first group Hi-pot conductors,
a plurality of first group functional conductors,
a plurality of first group relay-to-terminal conductors,
a plurality of second group Hi-pot conductors,
a plurality of second group functional conductors,
a plurality of second group relay-to-terminal conductors,
a plurality of first group relays,
a plurality of second group relays,
a plurality of first group terminals, and
a plurality of second group terminals,
all of the first group terminals and all of the second group terminals are mounted on the carrier, such that moving the carrier simultaneously moves all of the first group terminals and all of the second group terminals,
each of the first group relays comprises a first group Hi-pot conductor contact, a first group functional conductor contact, and a first group to-terminal contact,
each of the second group relays comprises a second group Hi-pot conductor contact, a second group functional conductor contact, and a second group to-terminal contact,
the plurality of first group Hi-pot conductors, the plurality of first group functional conductors, the plurality of first group relay-to-terminal conductors, the plurality of first group relays, and the plurality of first group terminals are arranged in a plurality of first group sub-units,
each first group sub-unit comprising one of the first group Hi-pot conductors, one of the first group functional conductors, one of the first group relay-to-terminal conductors, one of the first group relays and one of the first group terminals,
for each first group sub-unit, the first group Hi-pot conductor in the sub-unit is directly connected to the Hi-pot conductor contact of the first group relay in the sub-unit, the first group functional conductor is directly connected to the functional contact of the first group relay in the sub-unit, the first group relay-to-terminal conductor is directly connected to the to-terminal contact of the first group relay in the sub-unit, and the first group relay-to-terminal conductor in the sub-unit is directly connected to the first group terminal,
all of the plurality of first group Hi-pot conductors are directly electrically connected to each other,
the plurality of second group Hi-pot conductors, the plurality of second group functional conductors, the plurality of second group relay-to-terminal conductors, the plurality of second group relays, and the plurality of second group terminals are arranged in a plurality of second group sub-units,
each second group sub-unit comprising one of the second group Hi-pot conductors, one of the second group functional conductors, one of the second group relay-to-terminal conductors, one of the second group relays and one of the second group terminals,
for each second group sub-unit, the second group Hi-pot conductor in the sub-unit is directly connected to the Hi-pot conductor contact of the second group relay in the sub-unit, the second group functional conductor is directly connected to the functional contact of the second group relay in the sub-unit, the second group relay-to-terminal conductor is directly connected to the to-terminal contact of the second group relay in the sub-unit, and the second group relay-to-terminal conductor in the sub-unit is directly connected to the second group terminal, and
all of the plurality of second group Hi-pot conductors are directly electrically connected to each other.

In some embodiments in accordance with the first aspect of the present invention, the integrated test fixture further comprises at least one first group neutral conductor.

In some embodiments in accordance with the first aspect of the present invention:
the integrated test fixture further comprises at least a first power source, and
the first power source is configured to apply a voltage across (1) the plurality of first group Hi-pot conductors, and (2) the plurality of second group Hi-pot conductors.

In some embodiments in accordance with the first aspect of the present invention:
the integrated test fixture further comprises at least a first power source, a first group conductor and a second group conductor,
the first group conductor is directly electrically connected to each of the plurality of first group Hi-pot conductors,
the second group conductor is directly electrically connected to each of the plurality of second group Hi-pot conductors, and
the first power source is configured to apply a voltage across the first group conductor and the second group conductor.

In some embodiments in accordance with the first aspect of the present invention:
the integrated test fixture further comprises at least a first power source and one or more functional neutral conductors,
the first power source is configured to apply a voltage across (1) the plurality of first group Hi-pot conductors, and (2) the plurality of second group Hi-pot conductors, and
at least one of the at least a first power source is configured to apply a voltage across (1) any of the plurality of first group functional conductors, and (2) any of the one or more functional neutral conductors.

In some embodiments in accordance with the first aspect of the present invention:
the integrated test fixture further comprises at least a first power converter,
the power converter is configured to receive current at a first voltage and apply a second voltage across (1) the plurality of first group Hi-pot conductors, and (2) the plurality of second group Hi-pot conductors, and
the second voltage is greater than the first voltage.

In some of such embodiments:

the first voltage is in the range of from about 90 Volts to about 130 Volts, and the second voltage is at least 500 Volts, and/or the first voltage is in the range of from about 90 Volts to about 130 Volts, and the second voltage is at least 1200 Volts.

In some embodiments in accordance with the first aspect of the present invention, the integrated test fixture comprises at least five first group sub-units and at least five second group sub-units.

In some embodiments in accordance with the first aspect of the present invention:

for each of the first group relays in each of the first group sub-units, the default state is to electrically connect the first group Hi-pot conductor in the first group sub-unit to the relay-to-terminal conductor in the first group sub-unit, and for each of the second group relays in each of the second group sub-units, the default state is to electrically connect the second group Hi-pot conductor in the second group sub-unit to the relay-to-terminal conductor in the second group sub-unit.

In some of such embodiments, energizing one or more of the second group relays creates electrical connection between the at least one of the second group functional conductors and at least one respective second group relay-to-terminal conductor.

In some embodiments in accordance with the first aspect of the present invention:

the carrier is substantially rigid, all of the first group terminals and all of the second group terminals are substantially rigid and are fixedly mounted on the carrier, such that moving the carrier:

simultaneously moves all of the first group terminals and all of the second group terminals, and substantially retains a positional relationship among all of the first group terminals and all of the second group terminals.

In some embodiments in accordance with the first aspect of the present invention:

the integrated test fixture comprises a unit-under-test accommodation region, and a unit-under-test is in the unit-under-test accommodation region.

In some embodiments in accordance with the first aspect of the present invention:

the unit-under-test comprises a plurality of UUT terminals, and a positional relationship among all of the first group terminals and all of the second group terminals matches a positional relationship among all of the UUT terminals, such that each of the first group terminals and second group terminals is in electrical contact with a respective one of the UUT terminals.

In some embodiments in accordance with the first aspect of the present invention:

the integrated test fixture comprises a unit-under-test accommodation region, and a UUT positioner, the UUT positioner is configured to move a unit-under-test in the unit-under-test accommodation region relative to the carrier.

In some of such embodiments, the UUT positioner is configured to move the unit-under-test substantially vertically relative to the carrier, and/or the UUT positioner is configured to move the unit-under-test substantially linearly relative to the carrier.

In some embodiments in accordance with the first aspect of the present invention, the integrated test fixture further comprises a scanner configured to scan indicia on a unit-under-test.

In some embodiments in accordance with the first aspect of the present invention, the integrated test fixture further comprises a test result marker configured to place a physical marking on a unit-under-test.

In some embodiments in accordance with the first aspect of the present invention, the integrated test fixture further comprises a test result marker configured to place an electronic marking on a unit-under-test.

In some embodiments in accordance with the first aspect of the present invention:

the integrated test fixture comprises a unit-under-test accommodation region, and the integrated test fixture further comprises a unit-under-test transporter configured to move a unit-under-test to the unit-under-test accommodation region.

In some embodiments in accordance with the first aspect of the present invention:

the integrated test fixture further comprises a cover that comprises at least a first door, the first door has a closed position and at least one open position, the integrated test fixture further comprises at least a first power source, and the integrated test fixture is configured to prevent any high voltage from being applied across any component or components in the integrated test fixture with the door not in the closed position.

In a second aspect of the present invention, there is provided a universal test fixture, comprising:

a processor or a non-transitory tangible medium that provides instructions to:

(1) apply a first voltage across (a) a first group conductor that is directly electrically connected to a plurality of first group Hi-pot conductors, and (b) a second group conductor that is directly electrically connected to a plurality of second group Hi-pot conductors, while not energizing any of a plurality of first group relays and not energizing any of a plurality of second group relays;

(2) while said applying said first voltage across (a) the first group conductor and (b) the second group conductor, detecting an electrical condition on any one or more of the first group conductor, the plurality of first group Hi-pot conductors, the second group conductor and the plurality of second group Hi-pot conductors;

(3) cause at least a first of said plurality of first group relays (a) to break electrical connection between a first group Hi-pot conductor and a first group relay-to-terminal conductor, and (b) to make electrical connection between a first group functional conductor and the first group relay-to-terminal conductor, (4) cause at least a first of said plurality of second group relays (a) to break electrical connection between a second group Hi-pot conductor and a second group relay-to-terminal conductor, and (b) to make electrical connection between a second group functional conductor and the second group relay-to-terminal conductor, and (5) while the first of the plurality of first group relays is making electrical connection between the first group functional conductor and the first group relay-to-terminal conductor and the first of the plurality of second group relays is making electrical connection between the second group functional conductor and the second group relay-to-terminal conductor, (a) apply a second voltage across the first group first functional conductor and a neutral conductor, to supply current through (i) the first group first functional conductor, (ii) the first group first relay, and (iii) the first group first relay-to-terminal conductor, and (b) detect an electrical condition on the second group first functional conductor, the second group first relay and/or the second group first relay-to-terminal conductor.

In some embodiments in accordance with the second aspect of the present invention, said electrical condition on any one or more of the first group conductor, the plurality of first group Hi-pot conductors, the second group conductor and the plurality of second group Hi-pot conductors is whether or not a current in excess of a particular quantified value is flowing through any conductor among the plurality of first group Hi-pot conductors and the plurality of second group Hi-pot conductors. In some of such embodiments, the quantified value is 1 milliamp.

In some embodiments in accordance with the second aspect of the present invention, said electrical condition on the second group first functional conductor, the second group first relay and/or the second group first relay-to-terminal conductor is selected from among (1) whether a voltage is being applied, (2) whether a voltage being applied is inside or outside a particular range or ranges, (3) a quantified value of any voltage being applied, and (4) whether a current is flowing.

In some embodiments in accordance with the second aspect of the present invention, the universal test fixture further comprises one or more power cards, one or more relay cards, one or more AC current reading cards, one or more DC reading cards, and/or one or more programming cards.

In some embodiments in accordance with the second aspect of the present invention, the universal test fixture further comprises at least a first programming card that is capable of communicating with a unit-under-test.

In some embodiments in accordance with the second aspect of the present invention, the universal test fixture further comprises at least a first programming card that is capable of communicating wirelessly and/or through one or more wires with a unit-under-test.

In some embodiments in accordance with the second aspect of the present invention, the universal test fixture further comprises at least a first programming card that is capable of communicating wirelessly and/or through one or more wires with a unit-under-test via at least one communication protocol selected from among RS 485, RS 232 and TTL.

In some embodiments in accordance with the second aspect of the present invention, the universal text fixture further comprises at least a first power source.

In some embodiments in accordance with the second aspect of the present invention:

the universal text fixture further comprises at least a first power source, and the first power source is configured to apply a voltage across the first group conductor and the second group conductor.

In some embodiments in accordance with the second aspect of the present invention:

the universal test fixture further comprises a power converter, the power converter is configured to receive current at a first voltage and apply a second voltage across the first group conductor and the second group conductor, and the second voltage is greater than the first voltage.

In some embodiments in accordance with the second aspect of the present invention, the first voltage is in the range of from about 90 Volts to about 130 Volts, and the second voltage is at least 500 Volts. In some of such embodiments, the first voltage is in the range of from about 90 Volts to about 130 Volts, and the second voltage is at least 1200 Volts.

In a third aspect of the present invention, there is provided an integrated test system, comprising:

a carrier, a plurality of first group Hi-pot conductors, a plurality of first group functional conductors, a plurality of first group relay-to-terminal conductors, a plurality of second group Hi-pot conductors, a plurality of second group functional conductors, a plurality of second group relay-to-terminal conductors, a plurality of first group relays, a plurality of second group relays, a plurality of first group terminals, a plurality of second group terminals, at least one first group neutral conductor, and a processor or a non-transitory tangible medium, all of the first group terminals and all of the second group terminals are mounted on the carrier, such that moving the carrier simultaneously moves all of the first group terminals and all of the second group terminals, each of the first group relays comprises a first group Hi-pot conductor contact, a first group functional conductor contact, and a first group to-terminal contact, each of the second group relays comprises a second group Hi-pot conductor contact, a second group functional conductor contact, and a second group to-terminal contact, the plurality of first group Hi-pot conductors, the plurality of first group functional conductors, the plurality of first group relay-to-terminal conductors, the plurality of first group relays, and the plurality of first group terminals are arranged in a plurality of first group sub-units, each first group sub-unit comprising one of the first group Hi-pot conductors, one of the first group functional conductors, one of the first group relay-to-terminal conductors, one of the first group relays and one of the first group terminals, for each first group sub-unit, the first group Hi-pot conductor in the sub-unit is directly connected to the Hi-pot conductor contact of the first group relay in the sub-unit, the first group functional conductor is directly connected to the functional contact of the first group relay in the sub-unit, the first group relay-to-terminal conductor is directly connected to the to-terminal contact of the first group relay in the sub-unit, and the first group relay-to-terminal conductor in the sub-unit is directly connected to the first group terminal, all of the plurality of first group Hi-pot conductors are directly electrically connected to each other, for each of the first group relays in each of the first group sub-units, the default state is to electrically connect the first group Hi-pot conductor in the first group sub-unit to the relay-to-terminal conductor in the first group sub-unit, the plurality of second group Hi-pot conductors, the plurality of second group functional conductors, the plurality of second group relay-to-terminal conductors, the plurality of second group relays, and the plurality of second group terminals are arranged in a plurality of second group sub-units, each second group sub-unit comprising one of the second group Hi-pot conductors, one of the second group functional conductors, one of the second group relay-to-terminal conductors, one of the second group relays and one of the second group terminals, for each second group sub-unit, the second group Hi-pot conductor in the sub-unit is directly connected to the Hi-pot conductor contact of the second group relay in the sub-unit, the second group functional conductor is directly connected to the functional contact of the second group relay in the sub-unit, the second group relay-to-terminal conductor is directly connected to the to-terminal contact of the second group relay in the sub-unit, and the second group relay-to-terminal conductor in the sub-unit is directly connected to the second group terminal, all of the plurality of second group Hi-pot conductors are directly electrically connected to each other, for each of the second group relays in each of the second group sub-units, the default state is to electrically connect the second group Hi-pot conductor in the second group sub-unit to the relay-to-terminal conductor in the second group sub-unit, the processor or the non-transitory tangible medium configured to provide instructions to:

(1) apply a first voltage across (a) all of the plurality of first group Hi-pot conductors, and (b) all of the plurality of second group Hi-pot conductors, while not energizing any of the plurality of first group relays and not energizing any of the plurality of second group relays;

(2) while said applying said first voltage across all of the plurality of first group Hi-pot conductors, and all of the plurality of second group Hi-pot conductors, detecting an electrical condition on any one or more of the plurality of first group Hi-pot conductors, any other conductor that is directly electrically connected to any of the plurality of first group Hi-pot conductors, the plurality of second group Hi-pot conductors, and any other conductor that is directly electrically connected to any of the plurality of second group Hi-pot conductors;

(3) cause at least a first of said plurality of first group relays (a) to break electrical connection between a first group Hi-pot conductor and a first group relay-to-terminal conductor, and (b) to make electrical connection between a first group functional conductor and the first group relay-to-terminal conductor, (4) cause at least a first of said plurality of second group relays (a) to break electrical connection between a second group Hi-pot conductor and a second group relay-to-terminal conductor, and (b) to make electrical connection between a second group functional conductor and the second group relay-to-terminal conductor, and (5) while the first of the plurality of first group relays is making electrical connection between the first group functional conductor and the first group relay-to-terminal conductor and the first of the plurality of second group relays is making electrical connection between the second group functional conductor and the second group relay-to-terminal conductor, (a) apply a second voltage across the first group first functional conductor and a neutral conductor, to supply current through (i) the first group first functional conductor, (ii) the first group first relay, and (iii) the first group first relay-to-terminal conductor, and (b) detect an electrical condition on the second group first functional conductor, the second group first relay and/or the second group first relay-to-terminal conductor.

In some embodiments in accordance with the third aspect of the present invention:

the integrated test system further comprises at least a first power source, and the first power source is configured to apply a voltage across (1) the plurality of first group Hi-pot conductors, and (2) the plurality of second group Hi-pot conductors.

In some embodiments in accordance with the third aspect of the present invention:

the integrated test system further comprises at least a first power source, a first group conductor and a second group conductor, the first group conductor is directly electrically connected to each of the plurality of first group Hi-pot conductors, the second group conductor is directly electrically connected to each of the plurality of second group Hi-pot conductors, and the first power source is configured to apply a voltage across the first group conductor and the second group conductor.

In some embodiments in accordance with the third aspect of the present invention:

the integrated test system further comprises at least a first power source and one or more functional neutral conductors, the first power source is configured to apply a voltage across (1) the plurality of first group Hi-pot conductors, and (2) the plurality of second group Hi-pot conductors, and at least one of the at least a first power source is configured to apply a voltage across (1) any of the plurality of first group functional conductors, and (2) any of the one or more functional neutral conductors.

In some embodiments in accordance with the third aspect of the present invention:

the integrated test system further comprises at least a first power converter, the power converter is configured to receive current at a first voltage and apply a second voltage across (1) the plurality of first group Hi-pot conductors, and (2) the plurality of second group Hi-pot conductors, and the second voltage is greater than the first voltage.

In some of such embodiments, the first voltage is in the range of from about 90 Volts to about 130 Volts, and the second voltage is at least 500 Volts, and/or the first voltage is in the range of from about 90 Volts to about 130 Volts, and the second voltage is at least 1200 Volts.

In some embodiments in accordance with the third aspect of the present invention, the integrated test system comprises at least five first group sub-units and at least five second group sub-units.

In some embodiments in accordance with the third aspect of the present invention:

for each of the first group relays in each of the first group sub-units, the default state is to electrically connect the first group Hi-pot conductor in the first group sub-unit to the relay-to-terminal conductor in the first group sub-unit, and for each of the second group relays in each of the second group sub-units, the default state is to electrically connect the second group Hi-pot conductor in the second group sub-unit to the relay-to-terminal conductor in the second group sub-unit.

In some of such embodiments, energizing one or more of the second group relays creates electrical connection between the at least one of the second group functional conductors and at least one respective second group relay-to-terminal conductor.

In some embodiments in accordance with the third aspect of the present invention:

the carrier is substantially rigid, all of the first group terminals and all of the second group terminals are substantially rigid and are fixedly mounted on the carrier, such that moving the carrier:

simultaneously moves all of the first group terminals and all of the second group terminals, and substantially retains a positional relationship among all of the first group terminals and all of the second group terminals.

In some embodiments in accordance with the third aspect of the present invention:

the integrated test system comprises a unit-under-test accommodation region, and a unit-under-test is in the unit-under-test accommodation region.

In some of such embodiments:

the unit-under-test comprises a plurality of UUT terminals, and a positional relationship among all of the first group terminals and all of the second group terminals matches a positional relationship among all of the UUT terminals, such that each of the first group terminals and second group terminals is in electrical contact with a respective one of the UUT terminals.

In some embodiments in accordance with the third aspect of the present invention:

the integrated test system comprises a unit-under-test accommodation region, and a UUT positioner, the UUT positioner is configured to move a unit-under-test in the unit-under-test accommodation region relative to the carrier.

In some of such embodiments, the UUT positioner is configured to move the unit-under-test substantially vertically relative to the carrier, and/or the UUT positioner is configured to move the unit-under-test substantially linearly relative to the carrier.

In some embodiments in accordance with the third aspect of the present invention, the integrated test system further comprises a scanner configured to scan indicia on a unit-under-test.

In some embodiments in accordance with the third aspect of the present invention, the integrated test system further comprises a test result marker configured to place a physical marking on a unit-under-test.

In some embodiments in accordance with the third aspect of the present invention, the integrated test system further comprises a test result marker configured to place an electronic marking on a unit-under-test.

In some embodiments in accordance with the third aspect of the present invention:

the integrated test system comprises a unit-under-test accommodation region, and the integrated test system further comprises a unit-under-test transporter configured to move a unit-under-test to the unit-under-test accommodation region.

In some embodiments in accordance with the third aspect of the present invention:

the integrated test system further comprises a cover that comprises at least a first door, the first door has a closed position and at least one open position, the integrated test system further comprises at least a first power source, and the integrated test system is configured to prevent any high voltage from being applied across any component or components in the integrated test system with the door not in the closed position.

In some embodiments in accordance with the third aspect of the present invention, said electrical condition on any one or more of the first group conductor, the plurality of first group Hi-pot conductors, the second group conductor and the plurality of second group Hi-pot conductors is whether or not a current in excess of a particular quantified value is flowing through any conductor among the first group conductor, the plurality of first group Hi-pot conductors, the second group conductor and the plurality of second group Hi-pot conductors. In some of such embodiments, the quantified value is 1 milliamp.

In some embodiments in accordance with the third aspect of the present invention, said electrical condition on the second group first functional conductor, the second group first relay and/or the second group first relay-to-terminal conductor is selected from among (1) whether a voltage is being applied, (2) whether a voltage being applied is inside or outside a particular range or ranges, (3) a quantified value of any voltage being applied, and (4) whether a current is flowing.

In some embodiments in accordance with the third aspect of the present invention, the integrated test system further comprises one or more power cards, one or more relay cards, one or more AC current reading cards, one or more DC reading cards, and/or one or more programming cards.

In some embodiments in accordance with the third aspect of the present invention, the integrated test system further comprises at least a first programming card that is capable of communicating with a unit-under-test.

In some embodiments in accordance with the third aspect of the present invention, the integrated test system further comprises at least a first programming card that is capable of communicating wirelessly and/or through one or more wires with a unit-under-test.

In some embodiments in accordance with the third aspect of the present invention, the integrated test system further comprises at least a first programming card that is capable of communicating wirelessly and/or through one or more wires with a unit-under-test via at least one communication protocol selected from among RS 485, RS 232 and TTL.

In a fourth aspect of the present invention, there is provided a method, comprising applying a voltage across (1) the plurality of first group H-pot conductors, and (2) the plurality of second group Hi-pot conductors of an integrated test fixture as described herein, while:

a unit-under-test is in an accommodation region of the integrated test fixture, in each of the first group sub-units, the first group relay is providing electrical connection between the first group Hi-pot conductor and the first group relay-to-terminal conductor, and in each of the second group sub-units, the second group relay is providing electrical connection between the second group Hi-pot conductor and the second group relay-to-terminal conductor.

In some embodiments in accordance with the fourth aspect of the present invention, said voltage is at least 1200 Volts.

In a fifth aspect of the present invention, there is provided a method, comprising supplying current to the first group first functional conductor of an integrated test fixture as described herein, while:

a unit-under-test is in an accommodation region of the integrated test fixture, the first group first relay is not providing electrical connection between the first group first Hi-pot conductor and the first group first relay-to-terminal conductor, the first group first relay is providing electrical connection between the first group first functional conductor and the first group first relay-to-terminal conductor.

the second group first relay is not providing electrical connection between the second group first Hi-pot conductor and the second group first relay-to-terminal conductor, and the second group first relay is providing electrical connection between the second group first functional conductor and the second group first relay-to-terminal conductor.

In some embodiments in accordance with the fifth aspect of the present invention, the method further comprises detecting an electrical condition on the second group first functional conductor, the second group first relay, or the second group first relay-to-terminal conductor.

In a sixth aspect of the present invention, there is provided a method, comprising:

applying a Hi-pot voltage across (1) the plurality of first group H-pot conductors, and (2) the plurality of second group Hi-pot conductors of an integrated test fixture as described herein, while:

a unit-under-test is in an accommodation region of the integrated test fixture, in each of the first group sub-units, the first group relay is providing electrical connection between the first group Hi-pot conductor and the first group relay-to-terminal conductor, and in each of the second group sub-units, the second group relay is providing electrical connection between the second group Hi-pot conductor and the second group relay-to-terminal conductor, and supplying current to the first group first functional conductor of the integrated test fixture, while:

the unit-under-test is in the accommodation region of the integrated test fixture, the first group first relay is not providing electrical connection between the first group first Hi-pot conductor and the first group first relay-to-terminal conductor, the first group first relay is providing electrical connection between the first group first functional conductor and the first group first relay-to-terminal conductor.

the second group first relay is not providing electrical connection between the second group first Hi-pot conductor and the second group first relay-to-terminal conductor, and the second group first relay is providing electrical connection between the second group first functional conductor and the second group first relay-to-terminal conductor.

In some embodiments in accordance with the sixth aspect of the present invention, the method further comprises detecting an electrical condition on the second group first functional conductor, the second group first relay, or the second group first relay-to-terminal conductor.

In some embodiments in accordance with the sixth aspect of the present invention, said Hi-pot voltage is at least 1200 Volts.

The apparatus and the methods of the present invention thus avoid manual and duplicative work, and ensure seamless integration between multiple test processes. Automating such processes enables operator time spent on activities that would otherwise be required to manage these processes to be reduced or minimized, and/or enables operators to be redeployed to other activities.

The invention may be more fully understood with reference to the accompanying drawings and the following detailed description of the invention.

BRIEF DESCRIPTION OF THE DRAWING FIGURES

FIG. 1 is a schematic drawing depicting terminals 11 on a carrier 10 (of an integrated test fixture) in electrical contact with respective contacts 13 on a unit-under-test 12.

FIGS. 3-23 are schematic drawings depicted various components and aspects of a second representative embodiment in accordance with the present invention.

Figure 3:
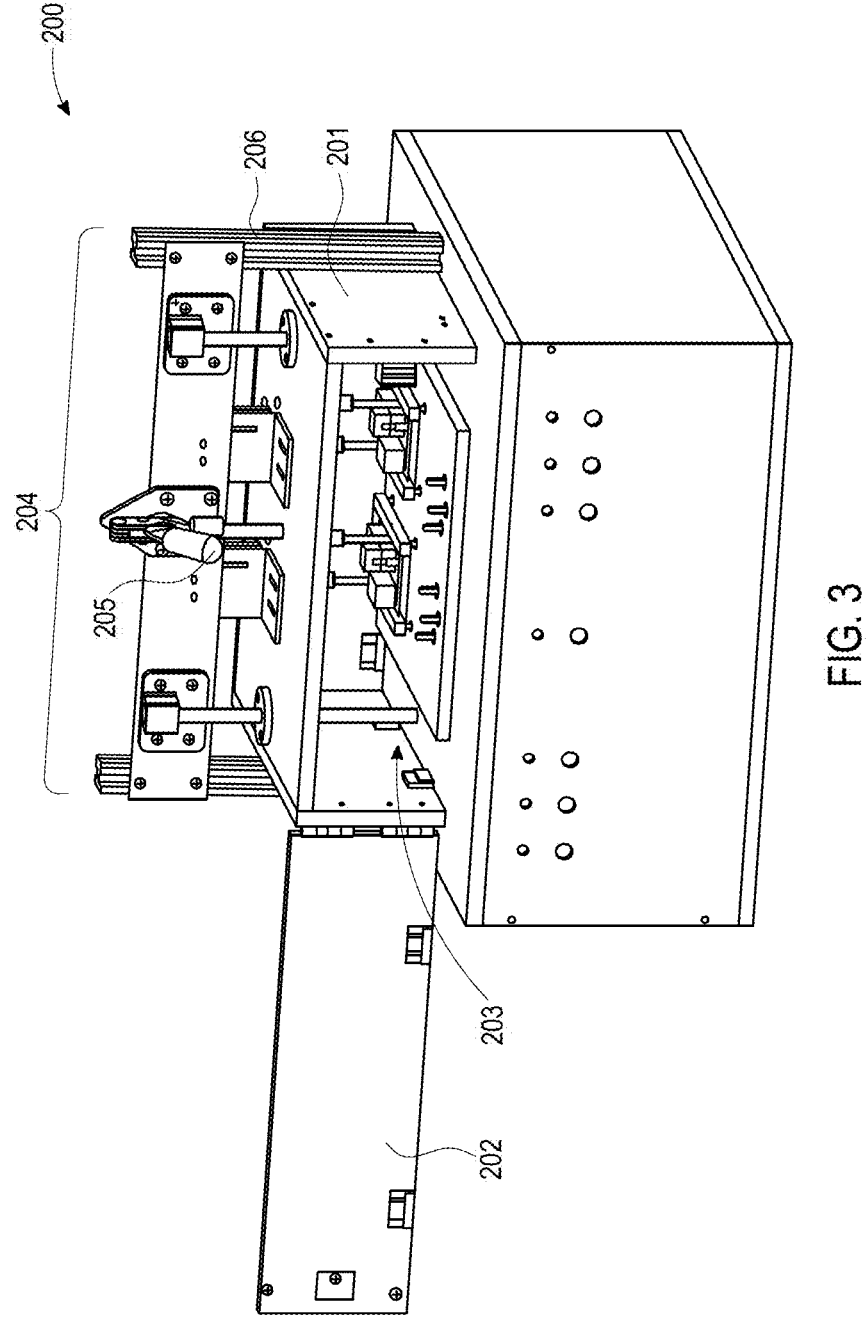

FIG. 3 depicts an integrated test fixture that comprises a cover 201, a door 202, a unit-under-test accommodation region 203 (that can accommodate two units-under-test), a UUT positioner 204 (including a handle 205 and a frame 206) that is configured to vertically move a unit-under-test in the unit-under-test accommodation region relative to a carrier. The integrated test fixtures also includes a number of interlocks 207 (in the form of magnets) which disable high voltage (i.e., prevent any high voltage from occurring in or on the integrated test fixture) if any part of the cover 201 is not in place, or if the door 202 is open.

Figure 4:
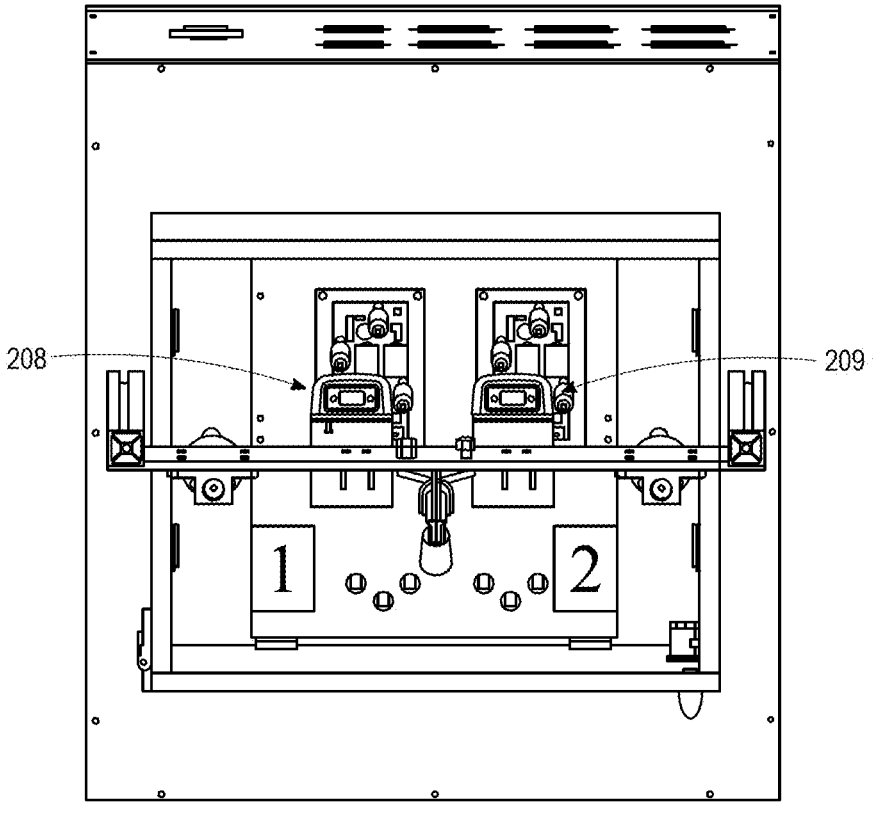

FIG. 4 depicts a top view of the integrated test fixture depicted in FIG. 3. This view shows a pair of QR scanners 208, 209 (one for each unit-under-test accommodation region).

Figure 5:
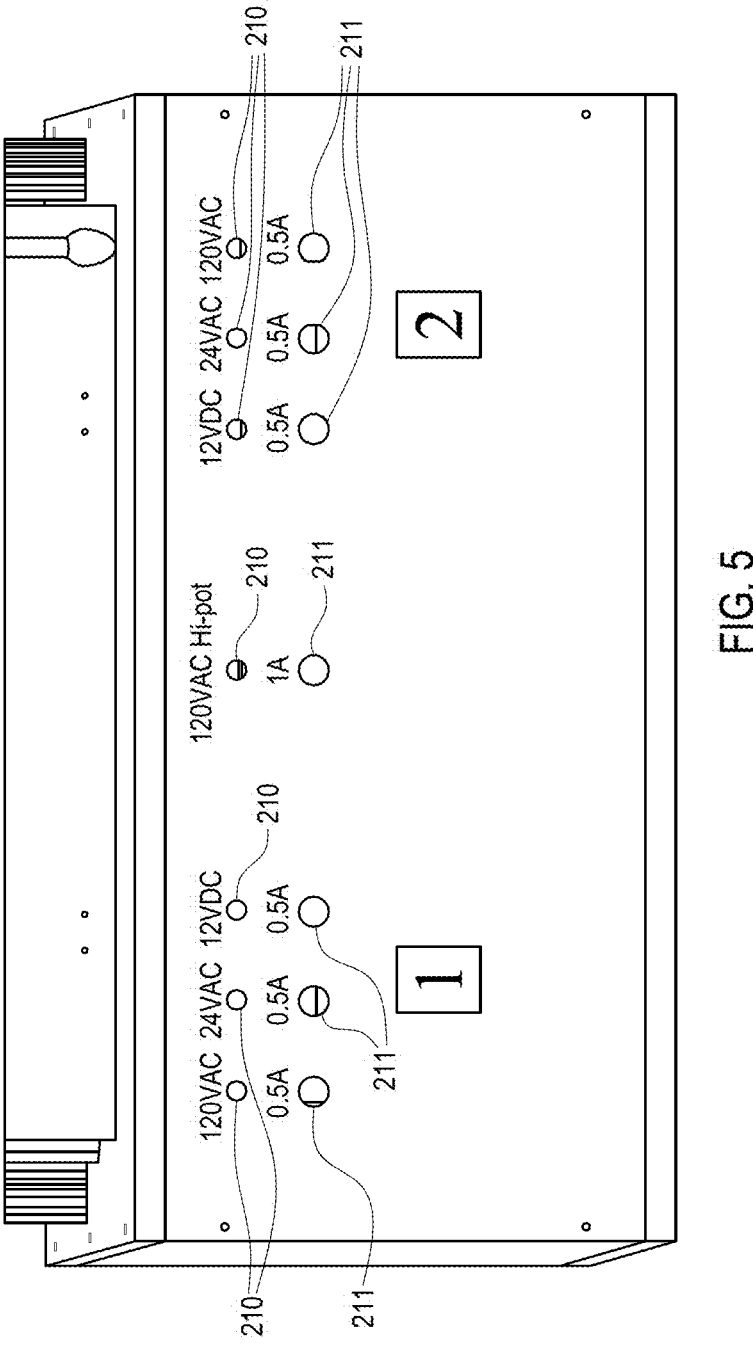

FIG. 5 depicts a close-up view of the front panel of the integrated test fixture depicted in FIG. 3. FIG. 5 shows fuses 210 and fuse indicators 211 for power being supplied to different systems with the integrated test fixture.

Figure 6:
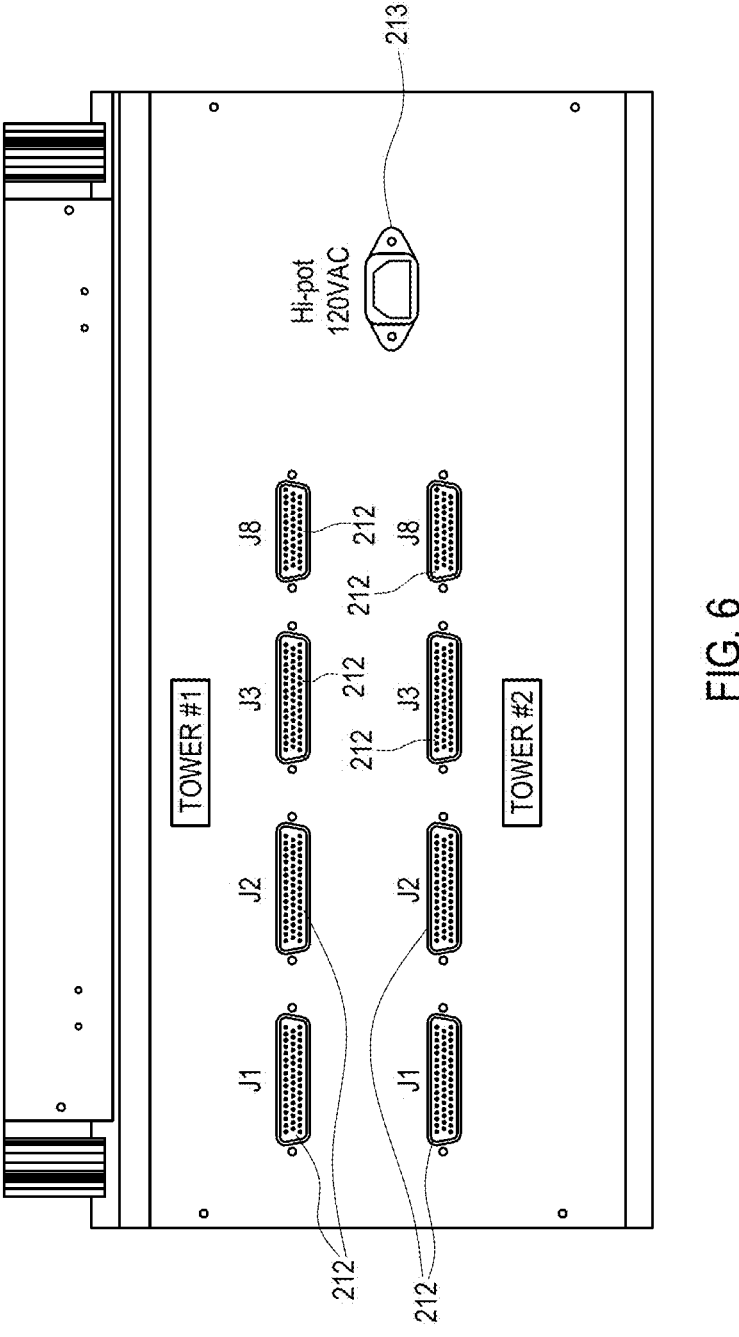

FIG. 6 depicts a rear view of the integrated test fixture depicted in FIG. 3. FIG. 6 shows interconnections 212 for connecting to two processors (i.e., first and second towers, i.e., first and second universal test fixtures) (one tower for each unit-under-test) and a 120 VAC Hi-pot power input 213.

Figure 7:
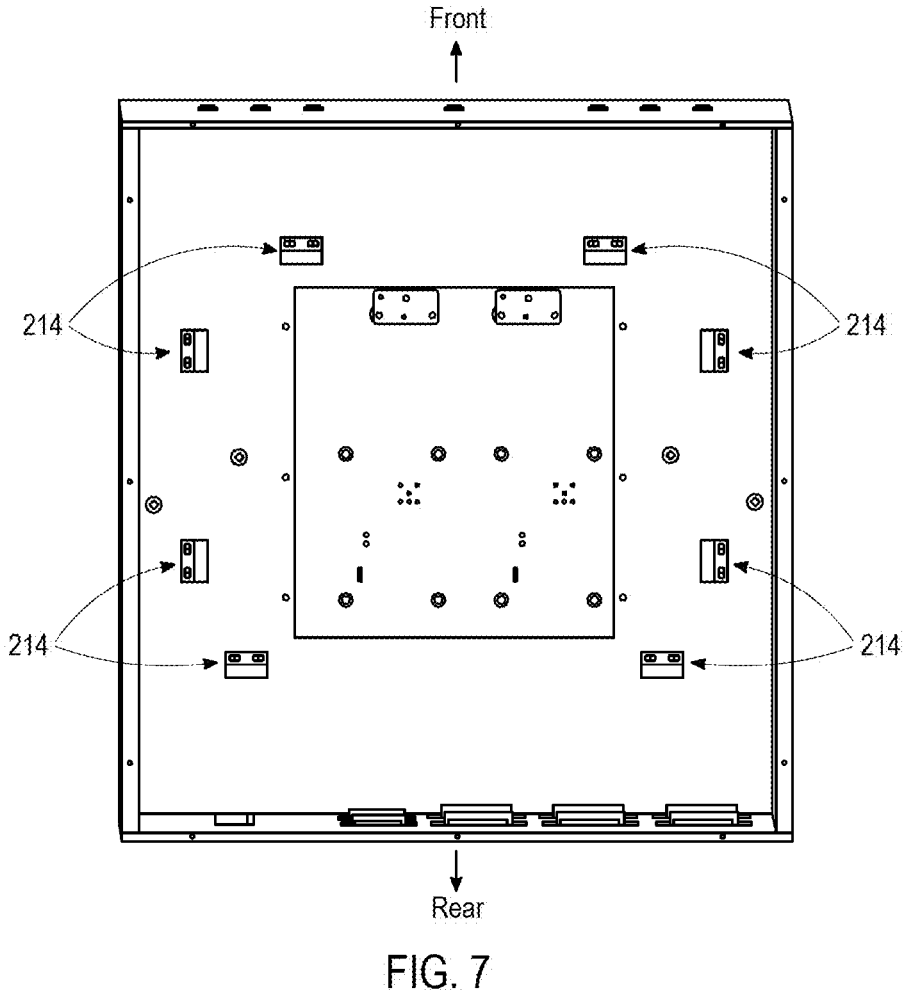

FIG. 7 depicts a bottom view of the integrated test fixture depicted in FIG. 3. FIG. 7 depicts interlocks 214, each of which interacts with one of the respective interlocks 207 to detect whether any part of the cover 201 is not in place, or if the door 202 is open.

Figure 8:
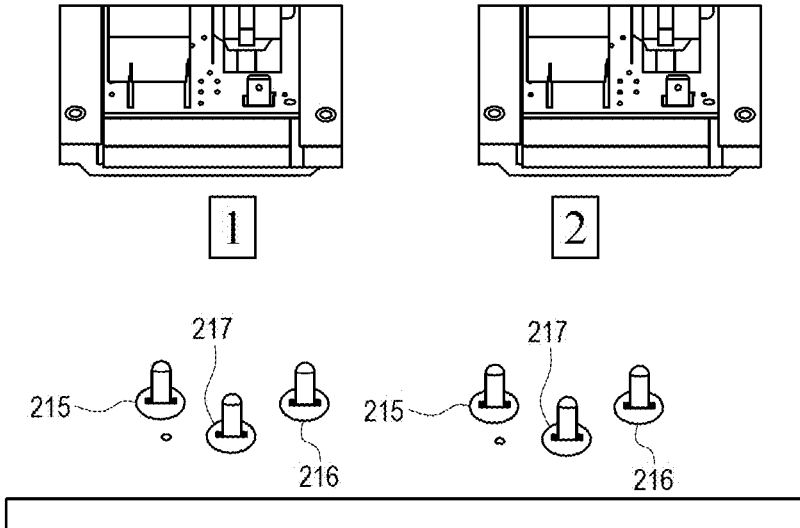

FIG. 8 depicts unit-under-test power cable spade connector locations on the integrated test fixture depicted in FIG. 3, namely, line cable spade connector locations 215, neutral cable spade connector locations 216 and ground cable spade connector locations 217.

FIG. 9 depicts a top view of control relays, and details thereof, in the integrated test fixture depicted in FIG. 3.

Figure 10A:
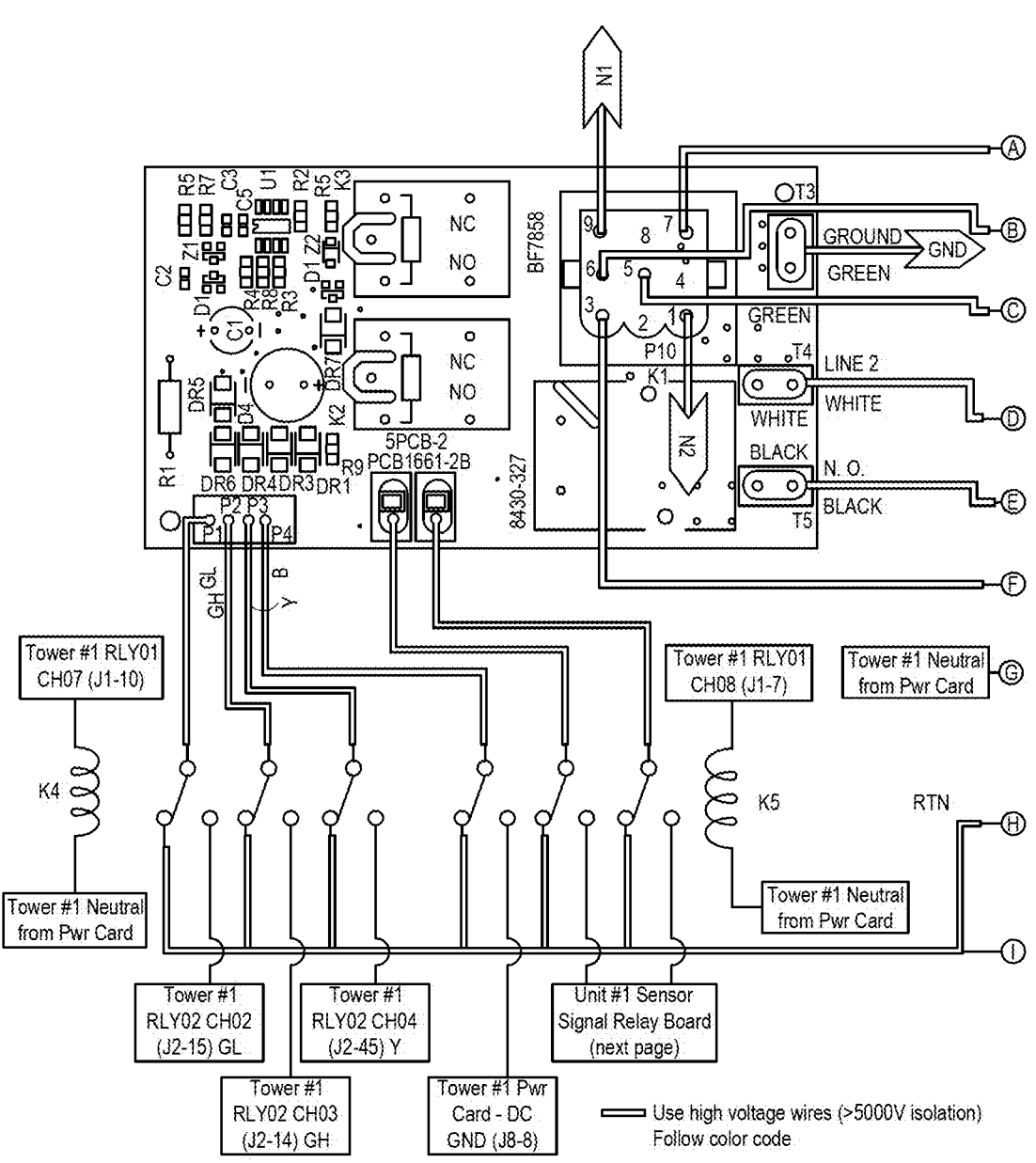
Figure 10B:
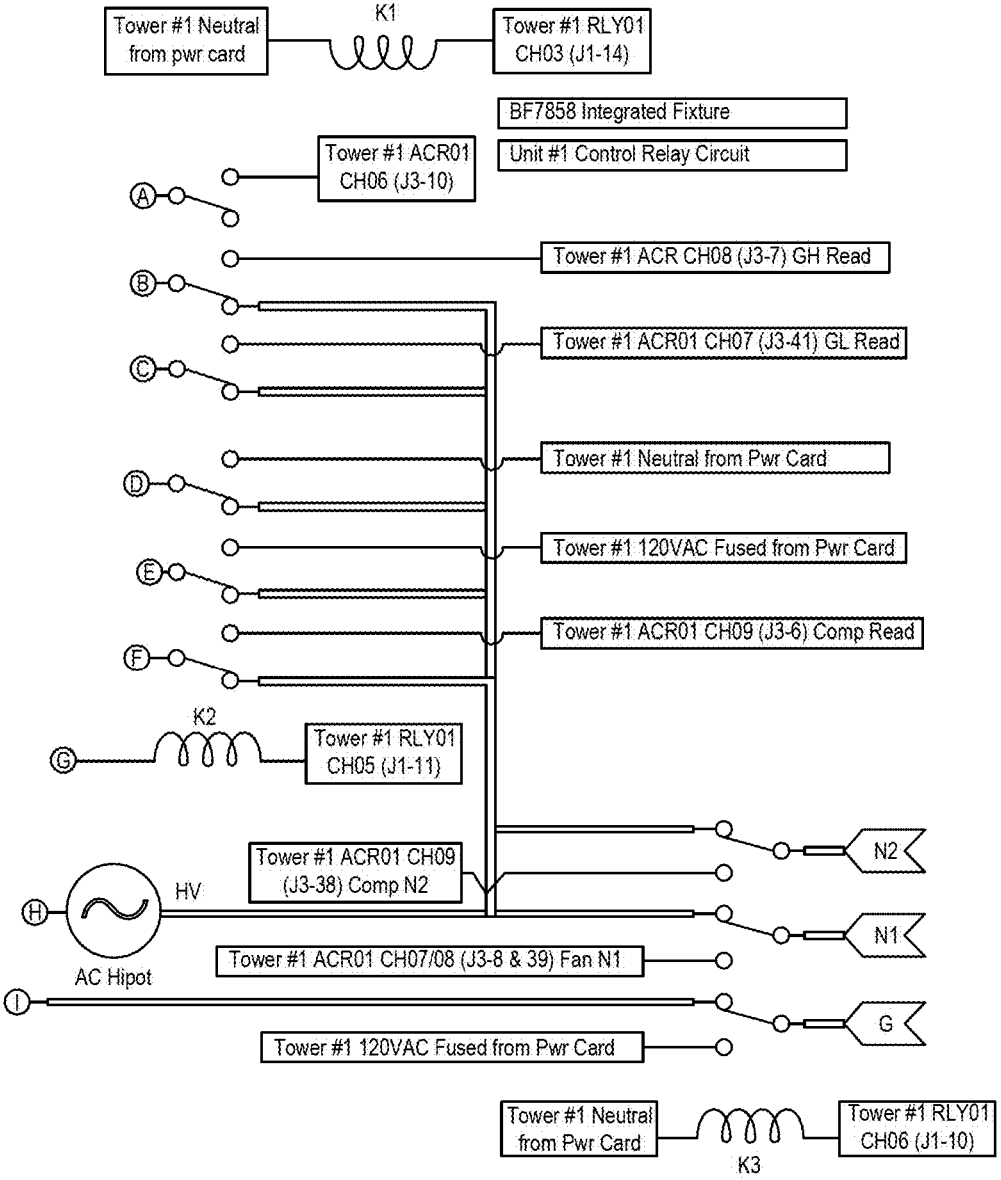

FIG. 10 depicts the control relay circuitry for the integrated test fixture depicted in FIG. 3

Figure 11:
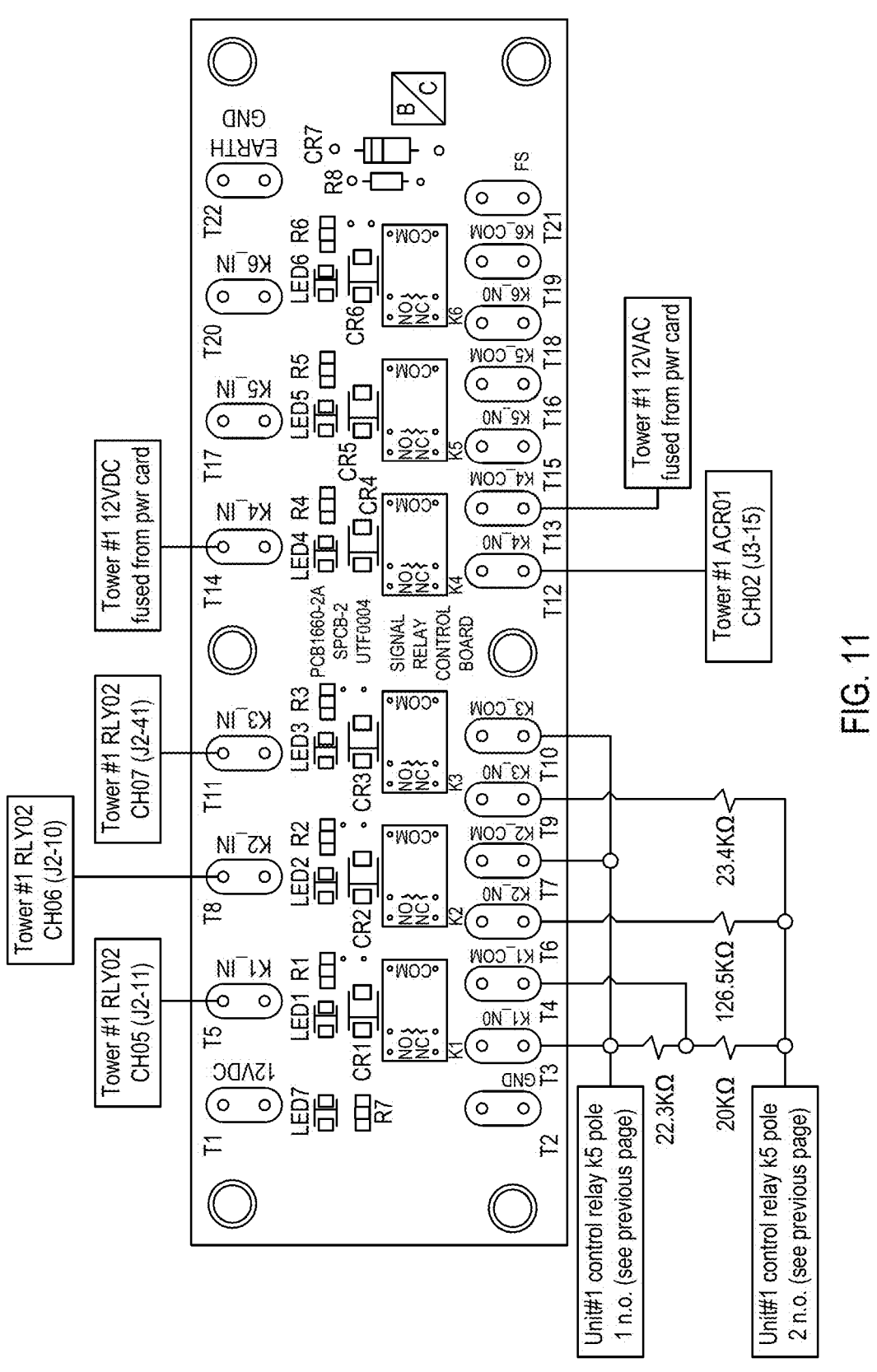

FIG. 11 depicts one of the signal relay boards in the integrated test fixture depicted in FIG. 3.

Figure 12:
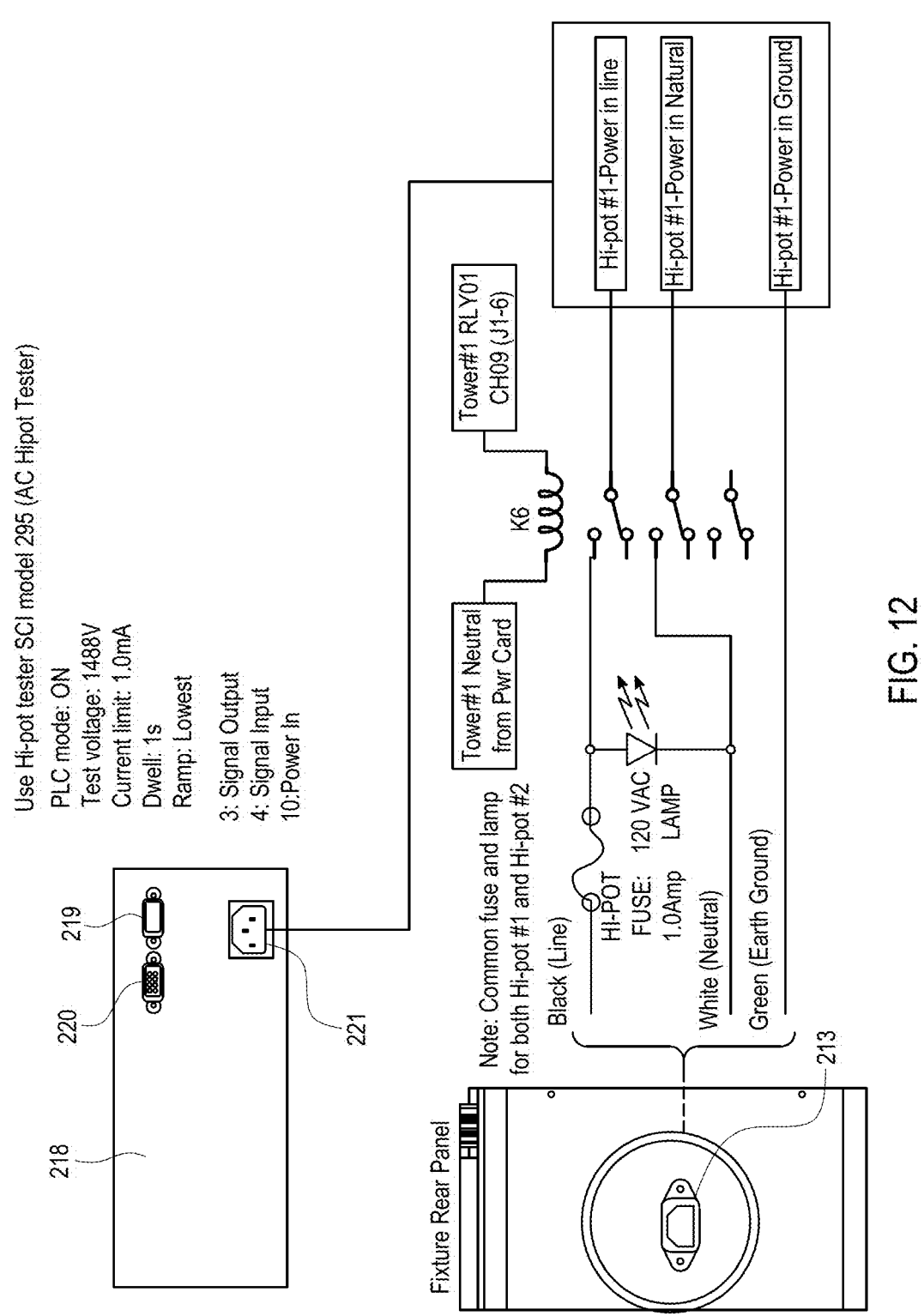

FIG. 12 depicts a rear view of a Hi-pot power device 218 (including a signal input 219, a signal output 220 and power in 221), and a rear view of the integrated test fixture panel, showing the 120 VAC Hi-pot power input 213.

Figure 13:
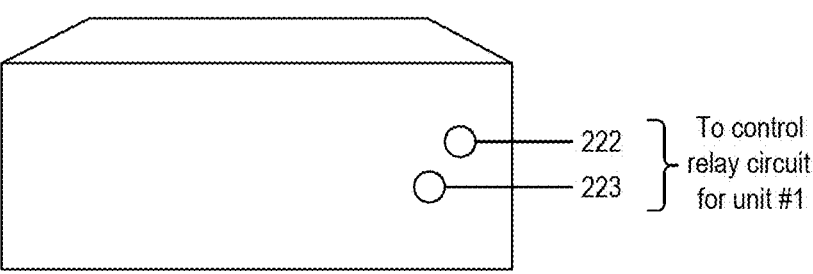

FIG. 13 depicts a front view of the Hi-pot power device 218, including HV 222 to the control relay circuit and RTN 223.

Figure 14:
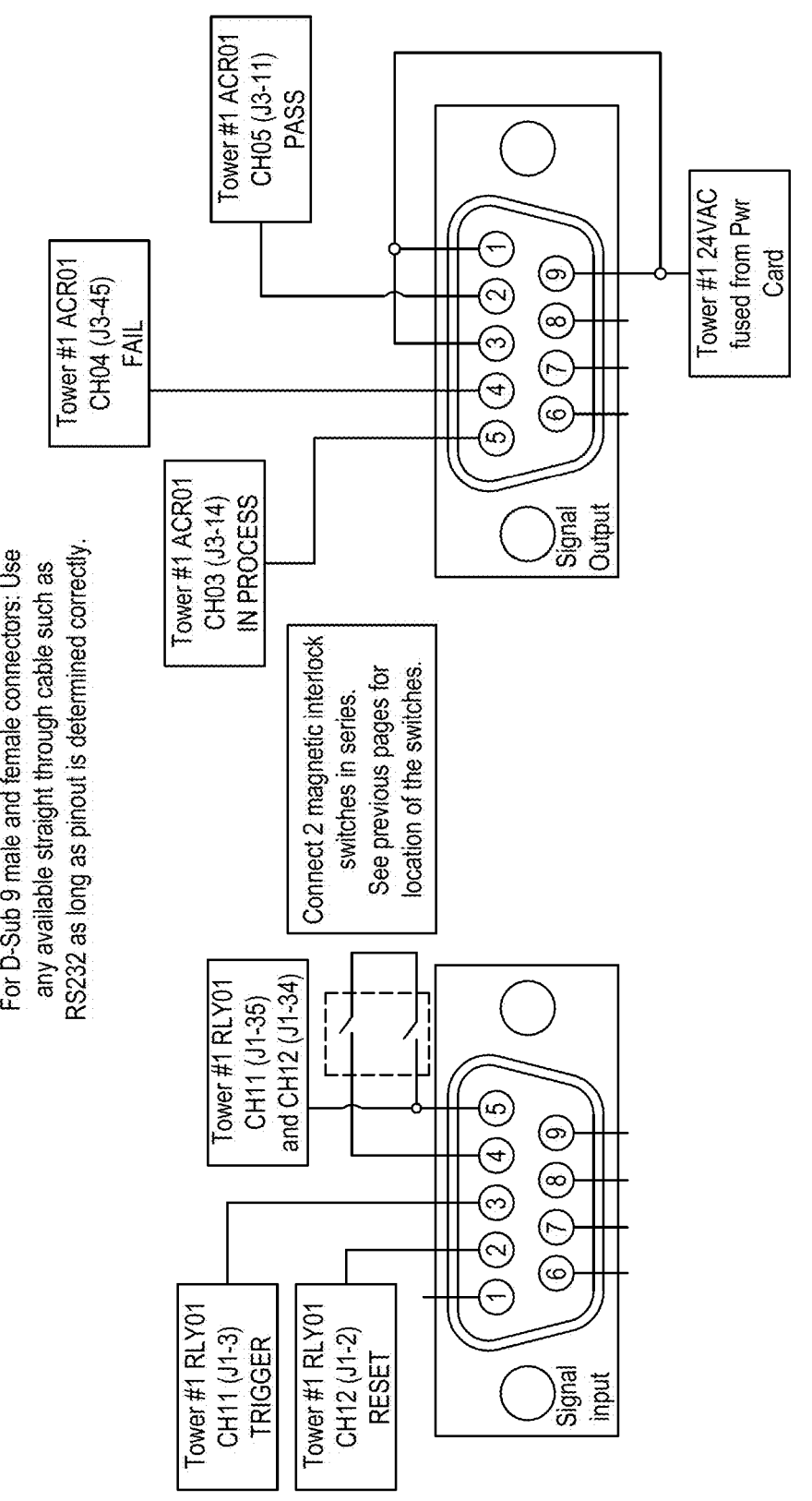

FIG. 14 depicts Hi-pot connections of the integrated test fixture for tower 1.

FIG. 15 depicts a unit-under-test 224, and components and characteristics thereof, including indicia 225 that is readable by the QR scanners 208, 209.

Figure 16:
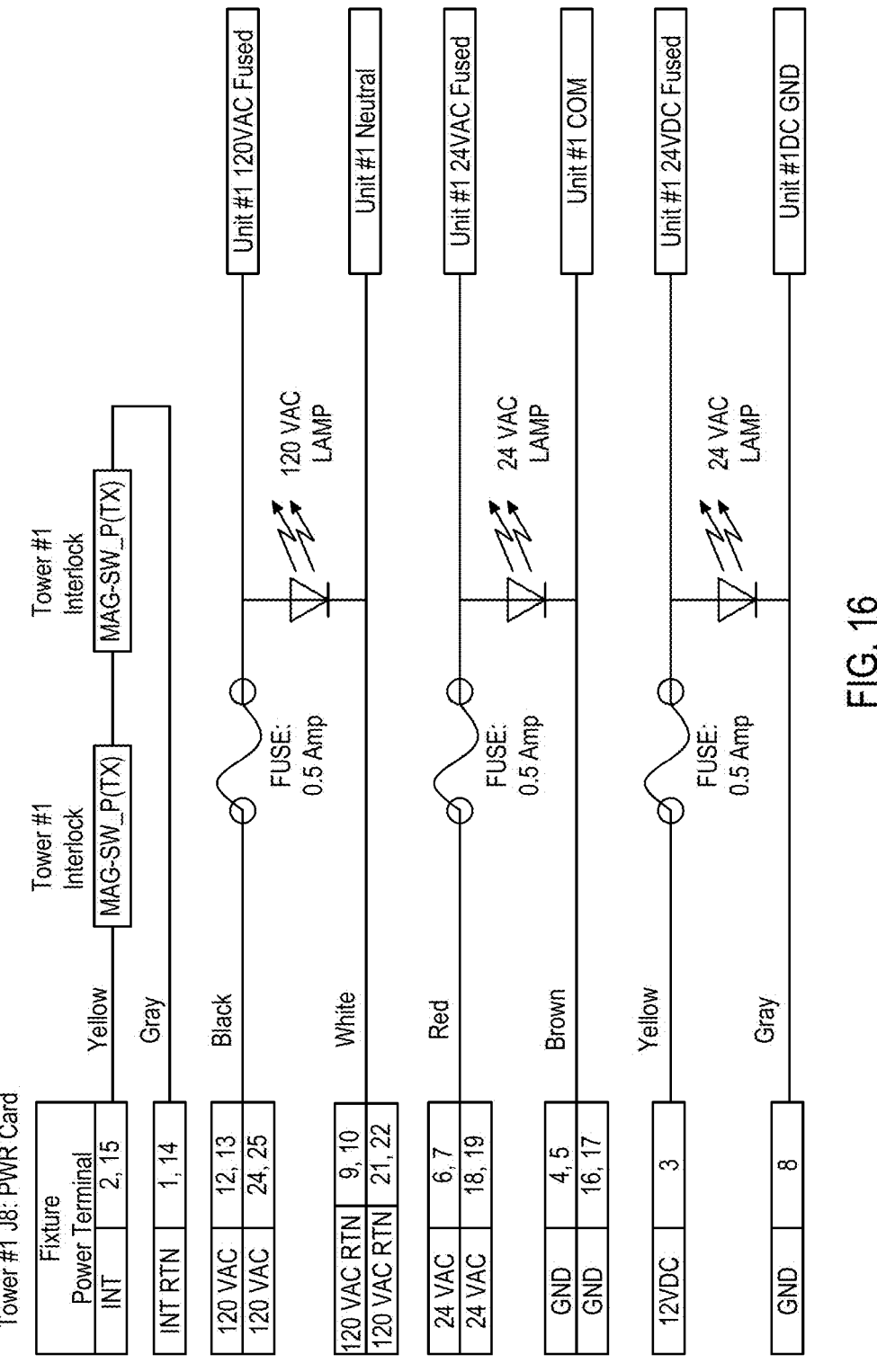

FIG. 16 depicts characteristics of a power card for the first tower.

Figure 17:
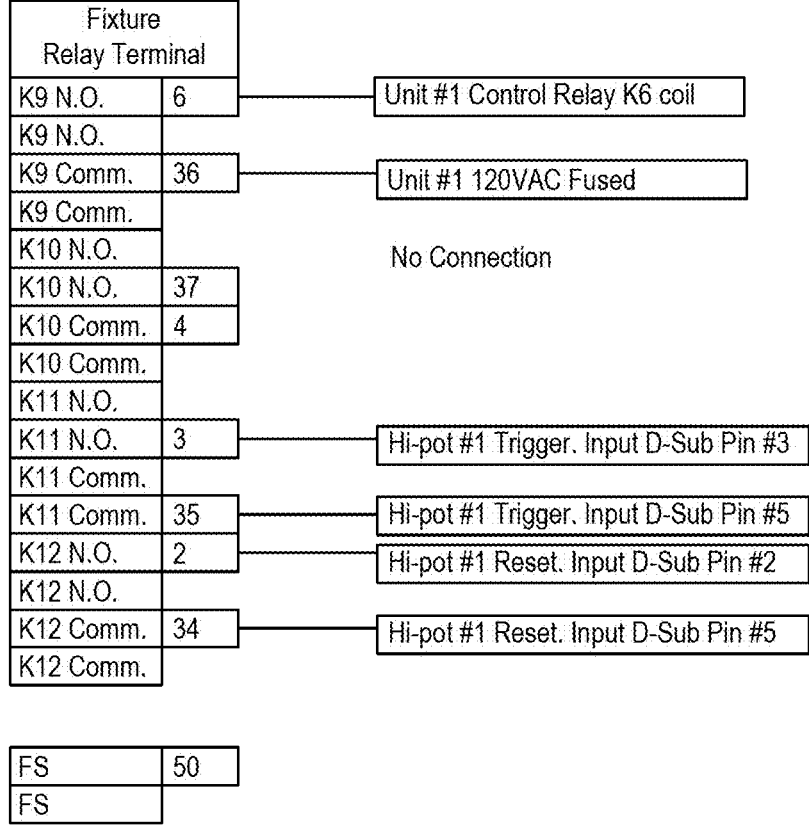

FIG. 17 depicts characteristics of a first relay card for the first tower.

FIG. 18 depicts characteristics of a second relay card for the first tower.

Figure 19B:
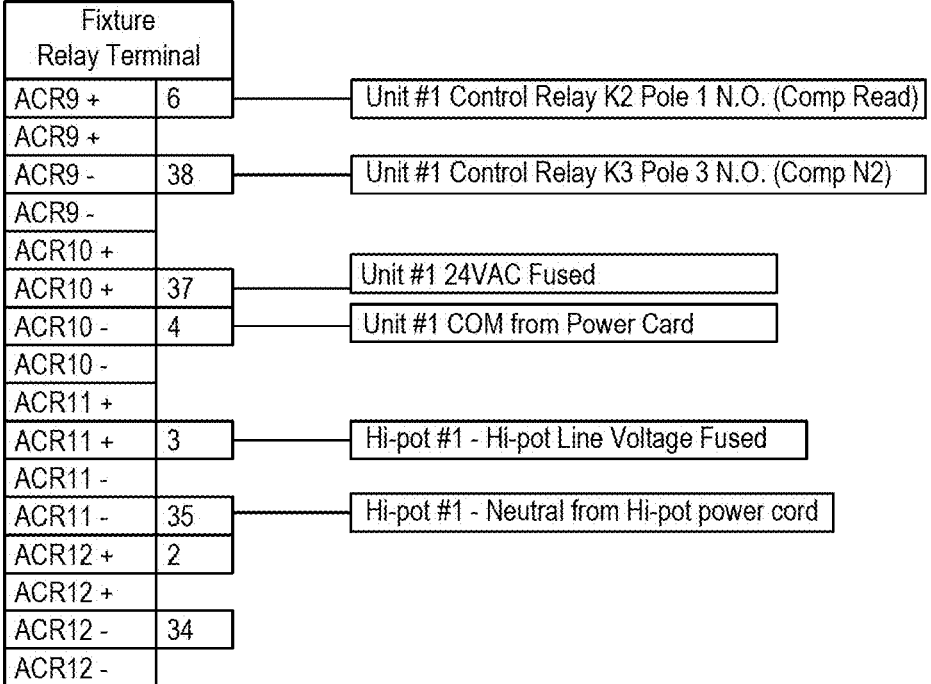

FIG. 19 depicts characteristics of an ACR (AC read) card for the first tower.

FIG. 20 depicts characteristics of the pinout for the power card in the first tower.

FIG. 21 depicts characteristics of the pinout for the relay card in the first tower.

Figure 22:
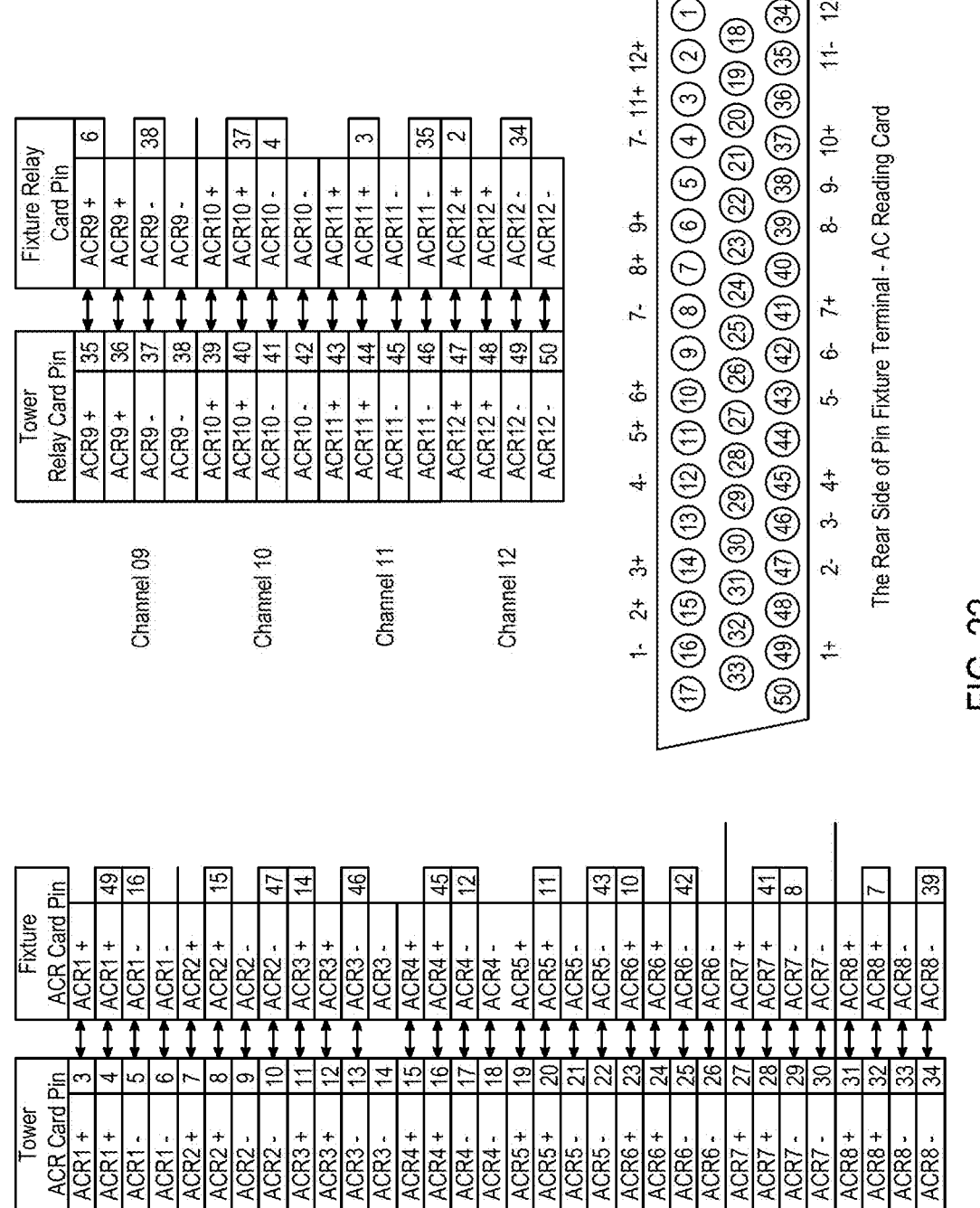

FIG. 22 depicts characteristics of the pinout for the ACR card in the first tower.

Figure 23:
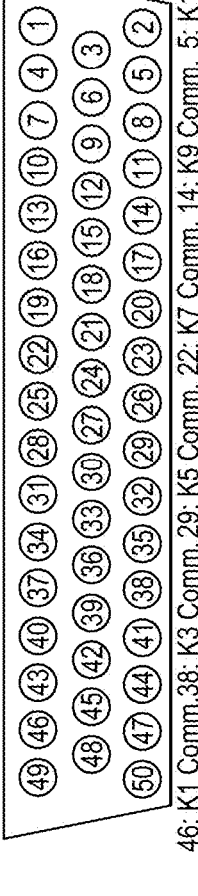

FIG. 23 depicts pinouts for the 50 pin fixture terminal and for a 50 pin IDC cable connector.

Figure 24:
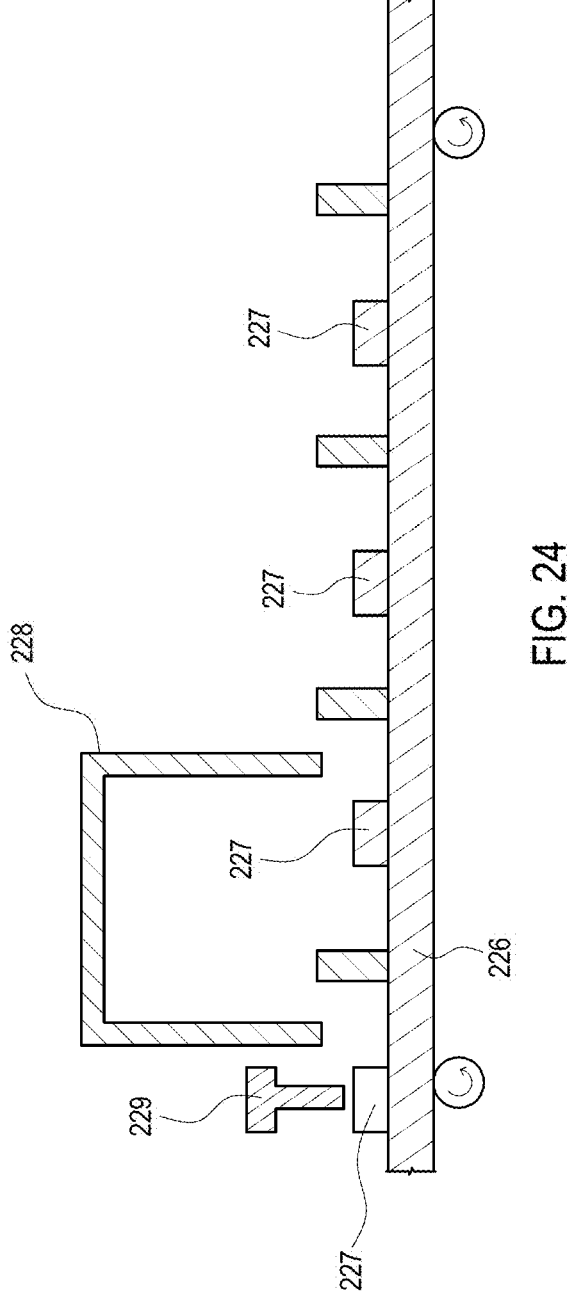

FIG. 24 schematically depicts a unit-under-test transporter 226 that is configured to move precisely units-under-test 227 into and out of an integrated test fixture 228. FIG. 24 also depicts a test result marker 229 that marks the unit-under-test (electronically or physically) to indicate results of the testing.

Figure 25:
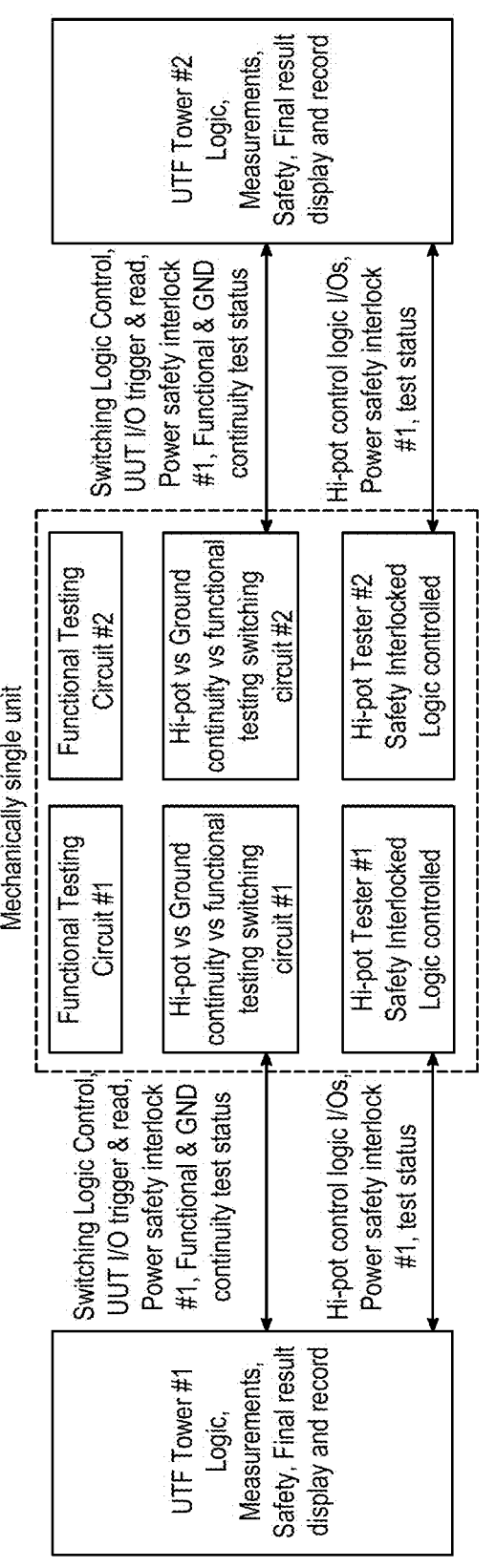

FIG. 25 is a block diagram schematically representing performance of Hi-pot testing and functional testing on two units-under-test in accordance with the present invention.

DETAILED DESCRIPTION OF THE INVENTION

Unless otherwise defined, all terms (including technical and scientific terms) used herein have the same meaning as commonly understood by one of ordinary skill in the art to which this invention belongs. Terms and expressions, such as those defined in commonly used dictionaries, should each be interpreted as having a meaning that is consistent with their meaning in the context of the relevant art and the present disclosure, and not in an idealized or overly formal sense (unless expressly so defined herein).

The expression "invention" is used herein to refer to any portion (or portions) of the inventive subject matter disclosed herein. As described herein, the present invention includes many aspects.

The expression "comprises" or "comprising," as used herein, is used in accordance with its well known usage, and means that the item that "comprises" the recited elements (or that is "comprising" the recited elements) includes at least the recited elements, and can optionally include any additional elements. For example, an integrated test fixture comprising a carrier includes at least one carrier, i.e., the integrated test fixture can include a single carrier or a plurality of carriers. An item that comprises a carrier and pluralities of ten other types of recited items can include just the carrier and the pluralities of ten other types of recited items, or it can include the carrier and the ten other types of recited items in addition to one or more other items that are not listed.

Any statement herein that an item is configured to perform some action (e.g., the first power source is configured to apply a voltage across (1) the plurality of first group Hi-pot conductors, and (2) the plurality of second group Hi-pot conductors) means that at least one component (or a combination of two or more components) in the item is configured to perform such action.

Where an expression is defined herein in terms of the meaning of the expression in the singular, the definition applies also to the plural (and vice-versa, i.e., for an expression defined herein in the plural, the definition applies also to the singular). Definitions of one form of an expression apply to the same expression in a different form of the word or words.

As used herein, the singular forms "a", "an" and "the" are intended to include the plural forms as well, unless the context clearly indicates otherwise.

Although the terms "first", "second", etc. may be used herein to describe various elements, components, parameters, etc., these numerical terms are used only to distinguish one element, component, parameter, etc. from another element, component, parameter, etc., and not to imply any order, position, ranking, etc.

The expression "mounted on," as used herein (e.g., in the expression "all of the first group terminals and all of the second group terminals are mounted on the carrier"), means that the first structure which is "on" a second structure can be in direct contact with the second structure, or can be separated from the second structure by one or more intervening structures (each side, or opposite sides, of which is/are in direct contact with the first structure, the second structure or one of the intervening structures). The first structure can be not embedded in the second structure (or an intervening structure), partially embedded in the second structure (or an intervening structure), or completely embedded in the second structure (or an intervening structure).

The expression "fixedly mounted on," as used herein (e.g., in the expression "all of the first group terminals and all of the second group terminals are rigid and are fixedly mounted on the carrier"), means that all of the items that are "fixedly mounted on" the carrier are substantially rigidly attached to the carrier (or to an intervening structure that is attached to the carrier or to another intervening structure), such that their respective positions in relation to one another cannot be substantially altered (without breaking something), i.e., a distance between a point on one terminal and a point on another terminal cannot be altered (without breaking something) by more than 5% of such distance (and in some cases, by not more than 2% or not more than 1%).

The expression "positioned in," as used herein (e.g., in the expression "positioned in the unit-under-test accommodation region"), means that the first item that is positioned in a second item is positioned relative to the second item, and does not imply necessarily that the second item (alone or in combination with one or more other item) encloses the first item in any way.

The expression "directly electrically connected," as used herein (e.g., in the expression "all of the plurality of first group Hi-pot conductors are directly electrically connected to each other"), means that the items that are described as being directly electrically connected to each other conduct electricity from one to the other, without substantially altering the voltage of the electricity, i.e., there is/are no components between the items that are electrically directly connected to each other that create a significant voltage drop (e.g., greater than 5% of the voltage) from one side of the component to the other (e.g., between items that are directly electrically connected, there are no components such as a power source, an insulator, or any other of a variety of electronic components); there can be, between items that are "directly electrically connected," small resistors (e.g., a wire connecting two conductors, or as part of one or the other of two conductors, can be thought of as a small resistor), relays (that can be energized or de-energized to conduct electricity between the items), switches (that can be closed to conduct electricity), voltage detectors, current detectors, etc.

The expression "electrically connected," as used herein, means that the items that are described as being electrically connected to each other are directly electrically connected to each other, or are both in a sequence of items that are directly electrically connected to each other via one or more intervening items that are each directly connected to other items in the sequence (e.g., a first electrically conductive item is directly electrically connected a second (intervening) electrically conductive item, and the second electrically conductive item is directly electrically connected to the first electrically conductive item at one location and the second electrically conductive item is also directly electrically connected to a third electrically conductive item at another location, such that the first electrically conductive item and the third electrically conductive item are "electrically connected" to each other (and they are "in electrical connection" with each other).

The expression "electrical contact," as used herein (e.g., in the expression "each of the first group terminals and second group terminals is in electrical contact with a respective one of the UUT terminals"), means that the items that are in "electrical contact" are in physical contact, or in close enough proximity, that electricity can be conducted from one of the items to the other (or others), i.e., such that they are electrically connected. For example, two electrically conductive structures (e.g., contacts in a relay) that are in physical contact (such that electricity can flow from one to the other) are in electrical contact; similarly, a terminal (mounted on a carrier) that is brought into physical contact with a contact mounted on a circuit board (such that electricity can flow from the terminal to the contact, and/or vice-versa), are in electrical contact.

The expression "substantially vertically," as used herein, (e.g., in the expression "the UUT positioner is configured to move the unit-under-test substantially vertically relative to the carrier"), means that an imaginary line connecting the locations of a particular point on the item that is/are being moved substantially vertically at any two times during such movement does not deviate from vertical by more than 10 degrees, and in some cases, does not deviate from vertical by more than 5 degrees (and/or an imaginary line connecting a location on one of the items to a location on the other item that is vertical at the beginning of such movement does not deviate from vertical by more than 10 degrees, and in some cases, does not deviate from vertical by more than 5 degrees, during such movement). During such movement either or both of the of the items that are moving "substantially vertically" relative to one another can be moving.

The expression "substantially linearly," as used herein, (e.g., in the expression "the UUT positioner is configured to move the unit-under-test substantially linearly relative to the carrier"), means that an imaginary line connecting the locations of an item that is/are being moved substantially linearly during at any two times during such movement does not deviate from a single direction by more than 10 degrees, and in some cases, does not deviate from a single direction by more than 5 degrees (and/or an imaginary line connecting a location on one of the items to a location on the other item that extends in a particular direction at the beginning of such movement does not deviate from that direction by more than 10 degrees, and in some cases, does not deviate from that direction by more than 5 degrees, during such movement). During such movement either or both of the of the items that are moving "substantially linearly" relative to one another can be moving.

As discussed below, the term "conductor," as used herein, refers to anything that conducts electricity, e.g., wires and traces.

As discussed below, the term "terminal," as used herein, refers to any conductive component (or a conductive region of a component) that is configured to be brought into electrical contact with another conductive component (or conductive region of a component) to establish electrical contact between the two components (i.e., such that the components become directly electrically connected).

As discussed below, the term "contact," as used herein, refers to any conductive component (or a conductive region of a component) that is configured to have a terminal come into electrical contact with it to establish a direct electrical connection (i.e., such that the terminal and the contact become directly electrically connected).

The expression "not electrically conductive," as used herein, means that the item that is "not electrically conductive" is substantially incapable of conducting electricity, e.g., applying a voltage of 1488 Volts across two points on the item results in no current, or less than 1 milliamp of current, passing from one point to the other.

As noted above, some aspects of the present invention (and/or embodiments in accordance with the present invention) comprise, or carry out actions on items that comprise:
  a carrier,
  a plurality of first group Hi-pot conductors,
  a plurality of first group functional conductors,
  a plurality of first group relay-to-terminal conductors,
  a plurality of second group Hi-pot conductors,
  a plurality of second group functional conductors,
  a plurality of second group relay-to-terminal conductors,
  a plurality of first group relays,
  a plurality of second group relays,
  a plurality of first group terminals, and
  a plurality of second group terminals.

In such aspects and/or embodiments, the carrier can be of any suitable shape and of any suitable size, and can be made of any suitable material (or materials) that is not (or are not) electrically conductive.

In some embodiments in accordance with the present invention, including some embodiments that include or do not include any of the features described herein, the carrier is substantially rigid, and all of the first group terminals and all of the second group terminals are substantially rigid and are fixedly mounted on the carrier, such that moving the carrier (1) simultaneously moves all of the first group terminals and all of the second group terminals, and (2) substantially retains a positional relationship among all of the first group terminals and all of the second group terminals. The expressions "substantially rigid," "fixedly mounted," and "substantially retains a positional relationship among all of the first group terminals and all of the second group terminals," in combination, mean that upon moving the carrier (without applying any force or forces other than the force that moves the carrier), the carrier and the terminals cannot change shape, and the locations on the carrier at which the terminals are attached to the carrier cannot move, to respective extents by which a distance between any particular point on any terminal and any particular point on any other terminal changes by more than 10% (or in some cases, by more than 5%).

In such aspects and/or embodiments, each of the conductors (i.e., the first group Hi-pot conductors, the first group functional conductors, the first group relay-to-terminal conductors, the second group Hi-pot conductors, the second group functional conductors, and the second group relay-to-terminal conductors) can be any item that conducts electricity, i.e., for each such conductor, applying a voltage of at least 12 Volts across two points of the conductor results in a voltage drop of not more than 10 percent (and in some cases, not more than 5 percent) between the two points. Representative examples of conductors include wires, traces, pins, prongs, buses, etc. Conductors can be made of any suitable electrically conductive material, e.g., metals, such as copper, aluminum, copper-covered steel, copper alloys, etc., and can be in any suitable shape and can be of any suitable size.

In such aspects and/or embodiments, a terminal can be of any suitable shape (e.g., in the shape of a prong (such as a round prong or a flat prong), a pin (which can be considered a round prong), a receptacle, or a surface (e.g., a contact), a wire, etc.), and can be of any suitable size, and can be made of any suitable electrically conductive material. A representative example of a suitable terminal is a pogo pin (also known as a spring-loaded pin), i.e., a terminal that comprises a conductive element that telescopes relative to a second element and that is biased (e.g., by a spring) toward a fully extended position (e.g., an electrical connector that comprises a plunger, a barrel and a spring, in which the barrel is shaped so as to retain the plunger (i.e., to stop the spring from pushing the plunger out of the barrel when the distal end of the plunger is not in contact with anything), and when force is applied to the distal end of the plunger (e.g., by the pogo pin being pressed into contact with an electrical contact on a unit-under-test), the spring is compressed and the plunger moves inside the barrel).

In such aspects and/or embodiments, each of the relays can comprise any suitable electronic relay (i.e., an electrically operated switch), a variety of which are well known and readily available to those of skill in the art. Each of the relays comprises at least three contacts (e.g., a first group relay comprises a first group Hi-pot conductor contact, a first group functional conductor contact, and a first group to-terminal contact), and the relay can switch between providing electrical connection between different combinations of contacts (e.g., between (1) providing electrical connection between the first group Hi-pot conductor contact and the first group to-terminal contact (while not providing electronic connection between the first group functional conductor contact and the first group to-terminal contact), and (2) providing electrical connection between the first group functional conductor contact and the first group to-terminal contact (while not providing electrical connection between the first group Hi-pot conductor contact and the first group to-terminal contact)). A representative example of a relay is a device that comprises a coil, an armature, contacts and a biasing element (e.g., a spring), in which when current is supplied to the coil, the coil acts as an electromagnet and generates a magnetic field, which causes movement of the armature to selectively provide electrical connection between respective contacts, the armature having a default state (where it provides electrical connection between a first combination of contacts when the biasing element pushes the armature to a first position), and an energized state (where it provides electrical connection between a second combination of contacts when a magnetic field produced by the coil pushes the armature to a second position, by overcoming the force of the biasing element tending to push the armature toward the first position).

As noted above, in some aspects, embodiments and/or methods in accordance with the present invention, there is provided at least one power source. Such a power source can be any suitable source of electric power, e.g., a battery, utility power (i.e., power from a power grid, passed through a service panel), power from a generator, power from a solar panel (or panels) supplied through an inverter, etc.

As noted above, in some aspects, embodiments and/or methods in accordance with the present invention, there is provided at least one power converter that is configured to receive current at a first voltage and apply a second voltage (greater than the first voltage) across (1) a plurality of first group Hi-pot conductors, and (2) a plurality of second group Hi-pot conductors (e.g., the first voltage is 110 Volts (or approximately 110 Volts), from a wall plug, and the second voltage is 1488 Volts (or approximately 1488 Volts)). Devices and components that can provide such conversion are well known to those of skill in the art, and are readily available.

As noted above, in some aspects, embodiments and/or methods in accordance with the present invention, there is provided an integrated test fixture that comprises an enclosure, e.g., a cover that comprises a closed position and at least one open position. Such an enclosure can be of any suitable shape and size, and can comprise any suitable material or materials, e.g., non-conductive acrylic and/or wooden panels.

As noted above, in some aspects, embodiments and/or methods in accordance with the present invention, there is provided an integrated test fixture that comprises a cover that comprises at least a first door that has a closed position and at least one open position, and the integrated test fixture is configured to prevent any high voltage being from applied across any component or components in the integrated test fixture with the door not in the closed position (to protect an operator from receiving a high voltage shock). An example of such an integrated test fixture comprises one or more door-mounted magnets that are positioned on the door and one or more adjacent magnets that are positioned adjacent to the respective door-mounted magnets, and one or more sensors that sense whether any door-mounted magnet is more than a threshold distance away from its respective adjacent magnet (e.g., the magnetic force between the door-mounted magnet and its adjacent magnet falls below a specific level), and that sends a signal upon a sensor sensing that any door-mounted magnet is more than a threshold distance away from its respective adjacent magnet, the signal causing the integrated test fixture to prevent any high voltage (e.g., a Hi-pot test voltage, such as 1488 Volts) from being applied across any component or components in the integrated test fixture.

As noted above, in some aspects, embodiments and/or methods in accordance with the present invention, there is provided an integrated test fixture that comprises a unit-under-test accommodation region. In such aspects, embodiments and/or methods, the unit-under-test accommodation region can be of any suitable shape and orientation that can hold a unit-under-test for which the integrated test fixture will be used to test. In some of such aspects, embodiments and/or methods, the accommodation region is within a cover that comprises at least a first door though which a unit-under-test can be loaded into the integrated test fixture or unloaded from the integrated test fixture.

As noted above, in some aspects, embodiments and/or methods in accordance with the present invention, the integrated test fixture comprises a unit-under-test accommodation region, and a unit-under-test is in the unit-under-test accommodation region. A unit-under-test can be any electronic device that can be subjected to a Hi-pot test and a functional test, and/or for which there is a desire or a need to perform a Hi-pot test and a functional test. In such aspects, embodiments and/or methods, the unit-under-test comprises a plurality of UUT terminals (e.g., in the form of contacts), and a positional relationship among at least some of the first group terminals mounted on the carrier and at least some of the second group terminals mounted on the carrier match a positional relationship among some or all of the UUT terminals, such that some or all of the first group terminals and some or all of the second group terminals on the integrated test fixture are in electrical contact with a respective one of the UUT terminals.

As noted above, in some aspects, embodiments and/or methods in accordance with the present invention, the integrated test fixture comprises a unit-under-test accommodation region, and a UUT positioner, and the UUT positioner is configured to move a unit-under-test positioned in the unit-under-test accommodation region relative to the carrier (i.e., the transporter can move the unit-under-test (alone or with the unit-under-test accommodation region) and/or the carrier, relative to one another. The UUT positioner can comprise any structure (or combination of structures) that is configured to move the unit-under-test relative to the carrier, to bring terminals on the carrier into electrical contact with terminals on a unit-under-test. A representative example of a UUT positioner can comprise a frame on which the unit-under-test accommodation region is vertically slidably mounted. Another representative example of a UUT positioner can comprise one or more pneumatic actuators that can be actuated to selectively move the unit-under-test accommodation region up and down vertically, to move terminals on the unit-under-test into or out of contact with terminals on the carrier. Another representative example of a UUT positioner can comprise one or more levers that an operator can manipulate to selectively move the unit-under-test accommodation region up and down vertically relative to the carrier, to move terminals on the unit-under-test into or out of contact with terminals on the carrier.

In some aspects, embodiments and/or methods in accordance with the present invention, the integrated test fixture comprises a unit-under-test accommodation region, and a presser that presses toward each other (1) a carrier and (2) a unit-under-test located in the unit-under-test accommodation region, to hold terminals on the carrier firmly in electrical connection with terminals on the unit-under-test. The presser can comprise any suitable structures, e.g., one or more levers that an operator can manipulate to also move the unit-under-test up and down (as discussed above), or one or more pneumatic actuators that also can be actuated to move the unit-under-test up and down (as discussed above), and/or a lock that can be moved (manually or electronically) to hold a unit-under-test relative to the carrier after the carrier and the unit-under-test have been moved relative to one another to bring the terminals on the carrier into electric connection with the terminals on the unit-under-test.

As noted above, in some aspects, embodiments and/or methods in accordance with the present invention, there is provided an integrated test fixture that comprises a scanner configured to scan indicia on a unit-under-test. Any suitable scanner can be employed, and a wide variety of scanners are known to those of skill in the art and are readily available. Representative examples of scanners include QR code scanners and bar code scanners. In such aspects, embodiments and/or methods, a universal test fixture can be provided, and the universal test fixture can provide instructions to scan a code (identifying the specific unit-under-test, and/or one or more attributes of the unit-under-test) on a unit-under-test at an appropriate time or times, and/or can cross-reference collected data relating to testing performed on a unit-under-test (e.g., the results of a Hi-pot test and/or any one or more functional tests) to the specific unit-under-test (as identified by the scanned code) regarding which the data was collected.

As noted above, in some aspects, embodiments and/or methods in accordance with the present invention, there is provided an integrated test fixture that further comprises a test result marker configured to place an electronic marking on a unit-under-test, or a test result marker configured to place a physical marking on a unit-under-test. A representative example of an electronic marking is data transferred to an electronic tag (e.g., an NFC tag, i.e., a near-field communication tag) wirelessly (e.g., via bluetooth or any other radio signal, or via an IR signal). Electronic tags (e.g., NFC tags and other electronic components to which data can be written and stored) are well known, and can include a plastic label with one or more chips and one or more antennas inside the plastic. In such aspects, embodiments and/or methods, a universal test fixture can be provided, and the universal test fixture can provide instructions to transit to the electronic tag at an appropriate time or times (and to record in the electronic tag) data that has been collected (e.g., the results of a Hi-pot test and/or any one or more functional tests conducted on the unit-under-test, such as whether the unit-under-test passed or failed any test, a reason that the unity-under-test failed a test (if applicable), and/or a work order number). Other data can be stored on the electronic tag, e.g., a serial number for the unit-under-test (and such data can be received by and also stored in the universal test fixture along with the test result data). A physical marking could be indicia (i.e., that can be detected visually) that is printed on the unit-under-test, likewise indicating the result(s) of one or more tests.

As noted above, in some aspects, embodiments and/or methods in accordance with the present invention, there is provided an integrated test fixture that further comprises a unit-under-test accommodation region and a unit-under-test transporter configured to move a unit-under-test to the unit-under-test accommodation region. Any device or system that is capable of transporting a unit-under-test can be employed. Representative examples of ways such a transporter can transport a unit-under-test include devices that comprise a region that is configured to be moved according to commands (e.g., received from a universal test fixture as described herein) and that is configured to lift and hold a unit-under-test (e.g., by clamping a portion of the unit, by suction and/or by applying a vacuum), or to convey the unit-under-test (e.g., on a conveyor belt), and move the unit-under-test to a desired location (e.g., into a unit-under-test accommodation region of an integrated test fixture as disclosed herein) while holding and/or supporting the unit-under-test, and to then release the unit-under-test.

As noted above, in some aspects, embodiments and/or methods in accordance with the present invention, there is provided a processor (i.e., a computer processor) and/or a non-transitory tangible medium. In such aspects, embodiments and/or methods, any suitable processor or processors, and/or any suitable non-transitory tangible medium (e.g., a compact disc, a DVD, a remote hard drive, a floppy disk, a flash drive, etc.), can be employed, a wide variety of processors and non-transitory tangible media being well known by those and skill in the art and being freely available.

As noted above, some aspects, embodiments and/or methods in accordance with the present invention involve detecting an electrical condition. Such an electrical condition can be whether or not a current in excess of a particular quantified value is flowing through a conductor or any of a plurality of conductors, whether a voltage is being applied, whether a voltage being applied is inside or outside a particular range or ranges, a quantified value of any voltage being applied, and/or whether a current is flowing.

People of skill in the art are familiar with a variety of devices and components that can detect whether or not a current in excess of a particular quantified value is flowing through a conductor or any of a plurality of conductors, and such devices and components are readily available.

People of skill in the art are also familiar with a variety of devices and components that can detect whether a voltage is being applied, and such devices and components are readily available.

People of skill in the art are also familiar with a variety of devices and components that can detect whether a voltage being applied is inside or outside a particular range or ranges, and such devices and components are readily available.

People of skill in the art are also familiar with a variety of devices and components that can detect a quantified value of any voltage being applied, and such devices and components are readily available.

People of skill in the art are also familiar with a variety of devices and components that can detect whether a current is flowing, and such devices and components are readily available.

As noted above, any of a wide variety of types functional testing can be carried out by integrated test fixtures or universal test fixtures in accordance with aspects and/or embodiments of the present invention, and/or by methods in accordance with the present invention. Such functional testing involves supplying to a unit-under-test a signal or other prompt that the unit-under-test is designed to receive and to perform a function upon receiving such signal or other prompt.

For example, one type of such function can be for the unit-under-test to receive a signal (e.g., a 12 Volt "call" signal) through a particular functional contact on the unit-under-test (e.g., a low-speed fan call contact), which prompts the unit-under-test to energize a relay that causes current to flow to operate a fan at a low speed.

Another type of function can be for the unit-under-test to receive a signal (e.g., a 12 Volt "call" signal) through another specific functional contact on the unit-under-test (e.g., a high-speed fan call contact), which prompts the unit-under-test to energize another relay that causes current to flow to operate the fan at a high speed.

Another type of function can be for the unit-under-test to receive a signal (e.g., a 12 Volt "call" signal) through another specific functional contact on the unit-under-test (e.g., a compressor call contact), which prompts the unit-under-test to energize another relay that causes current to flow to operate a compressor only so long as a detected ambient temperature is above a particular temperature (a compressor low temperature threshold), and to de-energize a relay to stop (or prevent) current from flowing to the compressor if the detected ambient temperature is below or falls below the compressor low temperature threshold (and then, after such de-energization occurs, to re-energize that relay if the detected ambient temperature increases to a point where it exceeds a compressor power restore temperature threshold. In performing such functions, the unit-under-test can be configured to detect temperature in any suitable way, e.g., using a thermistor (which sends a voltage signal indicative of its resistance, which varies depending on the ambient temperature), in which case the "detected ambient temperature" can be simulated during a functional test by the universal test fixture sending a signal of a voltage that represents a reading on the thermistor.

In some aspects, embodiments and/or methods in accordance with the present invention, there can be provided a universal test fixture that comprises a motherboard (connecting components of the universal test fixture), a processor, software (that provides instructions to be executed), one or more power cards, one or more relay cards, one or more AC current reading cards, one or more DC reading cards, and/or one or more programming cards that function, in combination to carry out instructions, e.g., instructions that carry out Hi-pot testing and/or one or more functional tests on a unit-under-test. People of skill in the art are familiar with and have access to a variety of motherboards, power cards, relay cards, AC current reading cards (e.g., to report that an AC voltage is being applied), DC reading cards (e.g., to report that a DC voltage is being applied), and programming cards, and with the benefit of the present specification, can readily configure, arrange and connect such cards such that the cards can communicate with one another and/or with the unit-under-test (e.g., using RS485, RS 232, TTL, etc.) as necessary to carry out Hi-pot testing and functional testing as described herein (e.g., in the manner shown in the specific embodiments described herein). For example, a user can indicate a desire for an integrated test system to perform a particular test or tests on a unit-under-test, and the universal test fixture will operate the cards in the universal test fixture to cause the integrated test fixture to perform the requested test or tests.

The present invention now will be described more fully hereinafter with reference to the accompanying drawings, in which representative embodiments of the invention are shown. Since the embodiments are representative, the present invention should not be construed as being limited to the specific features in the embodiments set forth herein.

Figure 1:
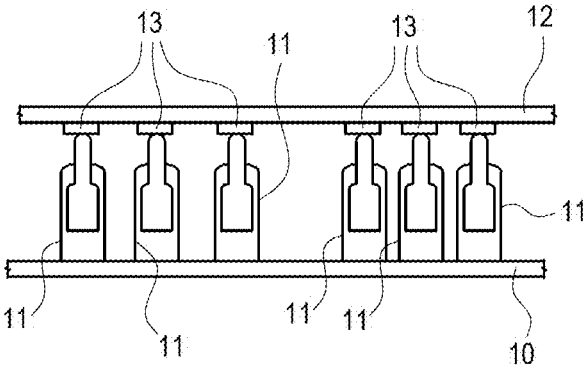

FIG. 1 is a schematic drawing depicting terminals 11 on a carrier 10 (of an integrated test fixture) in electrical contact with respective contacts 13 on a unit-under-test 12.

Figure 2:
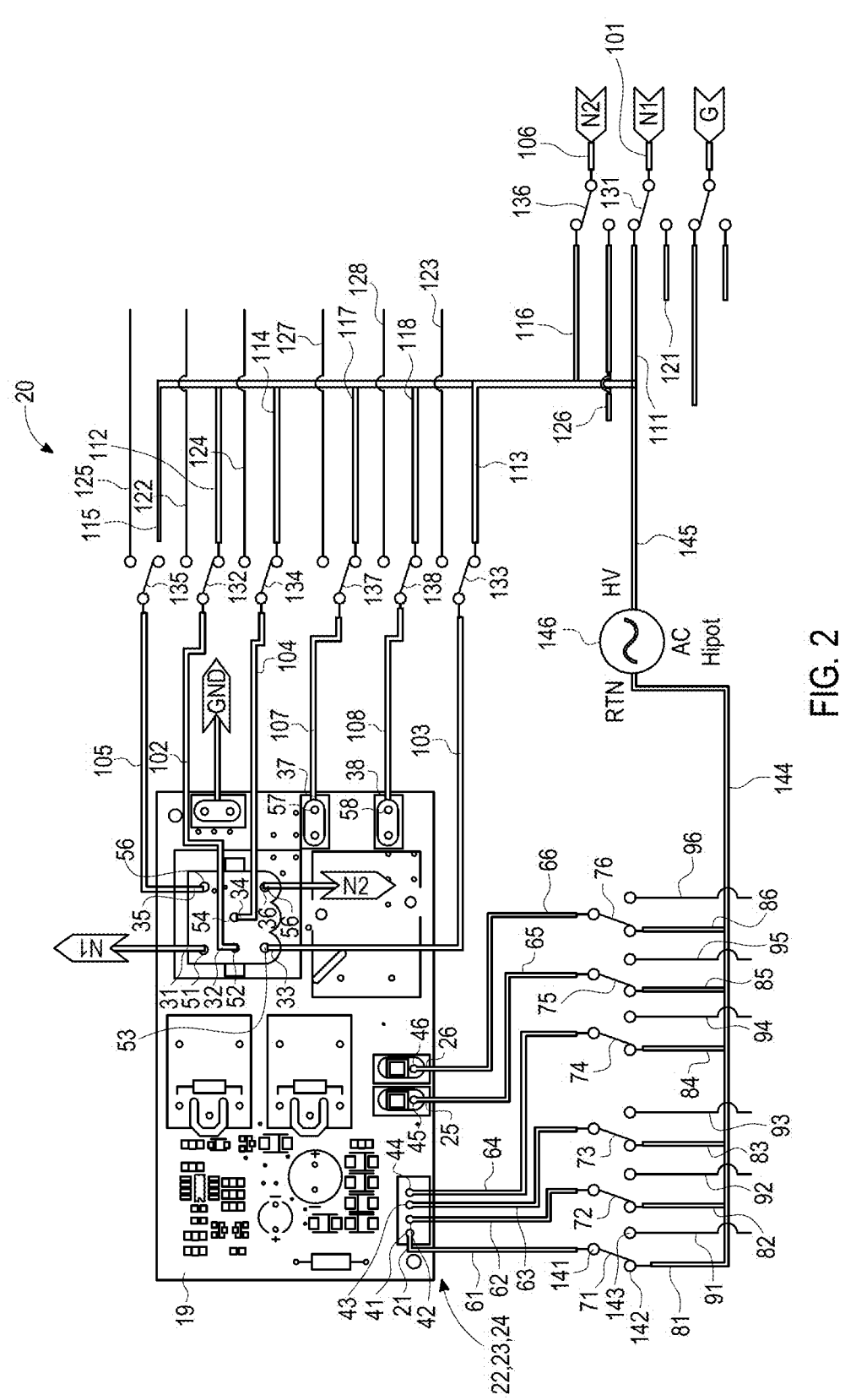
FIG. 2 is a schematic representation of the electrical relationships among a number of components of an integrated test fixture 20 and a unit-under-test 19 (that comprises a number of electronic components) in a first representative embodiment in accordance with the present invention.

FIG. 2 is a schematic representation of the electrical relationships among a number of components of an integrated test fixture 20 and a unit-under-test 19 (that comprises a number of electronic components) in a first representative embodiment in accordance with the present invention.

The integrated test fixture 20 comprises:

a first group first terminal 21, a first group second terminal 22, a first group third terminal 23, a first group fourth terminal 24, a first group fifth terminal 25, a first group sixth terminal 26, a first group first relay-to-terminal conductor 61, a first group second relay-to-terminal conductor 62, a first group third relay-to-terminal conductor 63, a first group fourth relay-to-terminal conductor 64, a first group fifth relay-to-terminal conductor 65, a first group sixth relay-to-terminal conductor 66, a first group first relay 71, a first group second relay 72, a first group third relay 73, a first group fourth relay 74, a first group fifth relay 75, a first group sixth relay 76, a first group first Hi-pot conductor 81, a first group second Hi-pot conductor 82, a first group third Hi-pot conductor 83, a first group fourth Hi-pot conductor 84, a first group fifth Hi-pot conductor 85, a first group sixth Hi-pot conductor 86, a first group first functional conductor 91, a first group second functional conductor 92, a first group third functional conductor 93, a first group fourth functional conductor 94, a first group fifth functional conductor 95, a first group sixth functional conductor 96, first through eighth second group terminals 31-38, first through eighth second group relay-to-terminal conductors 101-108, first through eighth second group relays 131-138, first through eighth second group Hi-pot conductors 111-118, first through eighth second group functional conductors 121-128, a first group conductor 144, a second group conductor 145, and a power source 146.

All of the first group terminals 21-26, first group relay-to-terminal conductors 61-66, first group relays 71-76, first group Hi-pot conductors 81-86, first group functional conductors 91-96, second group terminals 31-38, second group relay-to-terminal conductors 101-108, second group relays 131-138, second group Hi-pot conductors 111-118, and second group functional conductors 121-128 are mounted on a carrier, such that moving the carrier simultaneously moves all of the first group terminals 21-26 and all of the second group terminals 31-38.

Each of the relays comprises a Hi-pot conductor contact, a functional conductor contact, and a to-terminal contact. For example, the first group first relay 71 comprises a Hi-pot conductor contact 142, a functional conductor contact 143, and a to-terminal contact 141.

The Hi-pot conductors, the functional conductors, the relay-to-terminal conductors, the relays, and the terminals are arranged in respective sub-units, each sub-unit comprising one of the Hi-pot conductors, one of the functional conductors, one of the relay-to-terminal conductors, one of the relays and one of the terminals, wherein for each sub-unit, the Hi-pot conductor is directly connected to the Hi-pot conductor contact of the relay, the functional conductor is directly connected to the functional contact of the relay, the relay-to-terminal conductor is directly connected to the to-terminal contact of the relay, and the relay-to-terminal conductor in the sub-unit is directly connected to the first group terminal, e.g., the first group first Hi-pot conductor 81 is directly connected to the Hi-pot conductor contact of the first group first relay 71, the first group first functional conductor 91 is directly connected to the functional contact of the first group first relay 71, the first group first relay-to-terminal conductor 61 is directly connected to the to-terminal contact of the first group first relay 71, and the first group first relay-to-terminal conductor 61 is directly connected to the first group first terminal 21.

All of the plurality of first group Hi-pot conductors 81-86 are directly electrically connected to each other and to the first group conductor 144, and all of the plurality of second group Hi-pot conductors 111-118 are directly electrically connected to each other and to the second group conductor 145.

The first group first functional conductor 91 is a low speed fan call conductor.

The first group second functional conductor 92 is a high speed fan call conductor.

The first group third functional conductor 93 is a compressor call conductor.

The first group fourth functional conductor 94 is a neutral conductor i.e., for completing a circuit with the first functional conductor 91, the second functional conductor 92 or the third functional conductor.

The first group fifth functional conductor 95 is a first temperature sensor conductor.

The first group sixth functional conductor 96 is a second temperature sensor conductor.

The power source 146 is configured to apply a voltage across (1) the plurality of first group Hi-pot conductors 81-86, and (2) the plurality of second group Hi-pot conductors 111-118.

The unit-under-test 19 comprises a plurality of UUT terminals, in the form of UUT contacts 41-46 and UUT contacts 51-58. The UUT contacts 41-48 are electrically connected to respective electronic signal-receiving components (on the unit-under-test 19), and the UUT contacts 51-58 are electrically connected to respective electronic function-driving components (on the unit-under-test 19) that cause functions to be performed in response to signals received by respective electronic signal-receiving components.

A positional relationship among the first group terminals 21-26 matches a positional relationship among the UUT terminals 41-46, and a positional relationship among the second group terminals 31-38 matches a positional relationship among the UUT terminals 51-58, such that the each of the first group terminals and second group terminals is in electrical contact with a respective one of the UUT terminals.

By virtue of the electrical relationships depicted in FIG. 2, the integrated test fixture 20 can perform a Hi-pot test on the unit-under-test 19 by applying a voltage (e.g., 1488 Volts) across the first group conductor 144 and the second group conductor 145, and (with the unit-under-test still in the unit-under-test accommodation region), the integrated test fixture 20 can perform functional tests, including:

a low-speed fan call functional test, by energizing the first group first relay 71 (thereby electrically connecting the first group first functional conductor 91 to the first group first relay-to-terminal conductor 61), and applying a call signal (12 Volts) to the first group first functional conductor 91 (and not applying any voltage across the first group conductor 144 and the second group conductor 145), and detecting whether AC current is supplied to second group fourth functional conductor 124 (which is connected to the fan);

a high-speed fan call functional test, by energizing the first group second relay 72 (thereby electrically connecting the first group second functional conductor 92 to the first group second relay-to-terminal conductor 62), and applying a call signal (12 Volts) to the first group second functional conductor 92 (and not applying any voltage across the first group conductor 144 and the second group conductor 145), and detecting whether AC current is supplied to second group second functional conductor 122 (which is connected to the fan);

a series of compressor functional tests, by energizing the first group third relay 73 (thereby electrically connecting the first group third functional conductor 93 to the first group third relay-to-terminal conductor 63), and applying call signals (12 Volts) to the first group third functional conductor 93 (and not applying any voltage across the first group conductor 144 and the second group conductor 145), and supplying various temperature signals to the first group fourth functional conductor 94 and the first group fifth functional conductor 95, and detecting whether:

AC current is supplied to second group third functional conductor123 (which is connected to the compressor) upon applying a call signal to the first group third functional conductor 93 while the temperature signal supplied to first group fourth functional conductor 94 is greater than the compressor low temperature threshold (e.g., 28 degrees F.), and subsequently AC current supplied to the second group third functional conductor123 is discontinued upon the temperature signal falling below the compressor low temperature threshold, and subsequently AC current supplied to the second group third functional conductor123 is resumed upon the temperature signal rising to above the restore temperature threshold (e.g., 55 degrees F.);

AC current is not supplied to the second group third functional conductor123 upon applying a call signal to the first group third functional conductor 93 while the temperature signal supplied to first group fourth functional conductor 94 is below the compressor low temperature threshold, and subsequently AC current is supplied to the second group third functional conductor123 upon the temperature signal rising to above the restore temperature threshold (e.g., 55 degrees F.), and subsequently AC current supplied to the second group third functional conductor123 is discontinued upon the temperature signal again falling below the compressor low temperature threshold, etc.

FIGS. 3-23 are schematic drawings depicted various components and aspects of a second representative embodiment in accordance with the present invention.

FIG. 3 depicts an integrated test fixture that comprises a cover 201, a door 202, a unit-under-test accommodation region 203 (that can accommodate two units-under-test), a UUT positioner 204 (including a handle 205 and a frame 206) that is configured to vertically move a unit-under-test in the unit-under-test accommodation region relative to a carrier. The integrated test fixtures also includes a number of interlocks 207 (in the form of magnets) which disable high voltage (i.e., prevent any high voltage from occurring in or on the integrated test fixture) if any part of the cover 201 is not in place, or if the door 202 is open.

FIG. 4 depicts a top view of the integrated test fixture depicted in FIG. 3. This view shows a pair of QR scanners 208, 209 (one for each unit-under-test accommodation region).

FIG. 5 depicts a close-up view of the front panel of the integrated test fixture depicted in FIG. 3. FIG. 5 shows fuses 210 and fuse indicators 211 for power being supplied to different systems with the integrated test fixture.

FIG. 6 depicts a rear view of the integrated test fixture depicted in FIG. 3. FIG. 6 shows interconnections 212 for connecting to two processors (i.e., first and second towers, i.e., first and second universal test fixtures) (one tower for each unit-under-test) and a 120 VAC Hi-pot power input 213.

FIG. 7 depicts a bottom view of the integrated test fixture depicted in FIG. 3. FIG. 7 depicts interlocks 214, each of which interacts with one of the respective interlocks 207 to detect whether any part of the cover 201 is not in place, or if the door 202 is open.

FIG. 8 depicts unit-under-test power cable spade connector locations on the integrated test fixture depicted in FIG. 3, namely, line cable spade connector locations 215, neutral cable spade connector locations 216 and ground cable spade connector locations 217.

FIG. 9 depicts a top view of control relays, and details thereof, in the integrated test fixture depicted in FIG. 3.

FIG. 10 depicts the control relay circuitry for the integrated test fixture depicted in FIG. 3

FIG. 11 depicts one of the signal relay boards in the integrated test fixture depicted in FIG. 3.

FIG. 12 depicts a rear view of a Hi-pot power device 218 (including a signal input 219, a signal output 220 and power in 221), and a rear view of the integrated test fixture panel, showing the 120 VAC Hi-pot power input 213.

FIG. 13 depicts a front view of the Hi-pot power device 218, including HV 222 to the control relay circuit and RTN 223.

FIG. 14 depicts Hi-pot connections of the integrated test fixture for tower 1.

FIG. 15 depicts a unit-under-test 224, and components and characteristics thereof, including indicia 225 that is readable by the QR scanners 208, 209.

FIG. 16 depicts characteristics of a power card for the first tower.

FIG. 17 depicts characteristics of a first relay card for the first tower.

FIG. 18 depicts characteristics of a second relay card for the first tower.

FIG. 19 depicts characteristics of an ACR (AC read) card for the first tower.

FIG. 20 depicts characteristics of the pinout for the power card in the first tower.

FIG. 21 depicts characteristics of the pinout for the relay card in the first tower.

FIG. 22 depicts characteristics of the pinout for the ACR card in the first tower.

FIG. 23 depicts pinouts for the 50 pin fixture terminal and for a 50 pin IDC cable connector.

By virtue of the electrical relationships in the embodiment depicted in FIGS. 3-23, the integrated test fixture can perform Hi-pot tests simultaneously on two units-under-test (each in the manner as described above in relation to the embodiment depicted in FIG. 2), and (with the units-under-test still in the unit-under-test accommodation regions), the integrated test fixture can perform the functional tests described above in relation to the embodiment depicted in FIG. 2

FIG. 24 schematically depicts a unit-under-test transporter 226 that is configured to move precisely units-under-test 227 into and out of an integrated test fixture 228. FIG. 24 also depicts a test result marker 229 that marks the unit-under-test (electronically or physically) to indicate results of the testing.

FIG. 25 is a block diagram schematically representing performance of Hi-pot testing and functional testing on two units-under-test in accordance with the present invention.

Each component described herein can be a unitary one-piece structure. In some cases, if suitable, two or more structural parts of the devices described herein can be integrated, and/or a component can be provided in two or more parts (which are held together, if necessary). Similarly, any two or more functions can be conducted simultaneously, and/or any function can be conducted in a series of steps.

Furthermore, while certain embodiments of the present invention have been illustrated with reference to specific combinations of elements and attributes, various other combinations may also be provided without departing from the teachings of the present invention. Thus, the present invention should not be construed as being limited to the particular exemplary embodiments described herein and illustrated in the Figures, but may also encompass combinations of elements and attributes of the various illustrated embodiments.

Based on the information provided in the present disclosure, many alterations and modifications may be made by those having ordinary skill in the art, given the benefit of the present disclosure, without departing from the spirit and scope of the invention.

The invention claimed is:

1. An integrated test fixture, comprising:
a carrier,
a plurality of first group Hi-pot conductors,
a plurality of first group functional conductors,
a plurality of first group relay-to-terminal conductors,
a plurality of second group Hi-pot conductors,
a plurality of second group functional conductors,
a plurality of second group relay-to-terminal conductors,
a plurality of first group relays,
a plurality of second group relays,
a plurality of first group terminals, and
a plurality of second group terminals,
all of the first group terminals and all of the second group terminals are mounted on the carrier, such that moving the carrier simultaneously moves all of the first group terminals and all of the second group terminals,
each of the first group relays comprises a first group Hi-pot conductor contact, a first group functional conductor contact, and a first group to-terminal contact,
each of the second group relays comprises a second group Hi-pot conductor contact, a second group functional conductor contact, and a second group to-terminal contact,
the plurality of first group Hi-pot conductors, the plurality of first group functional conductors, the plurality of first group relay-to-terminal conductors, the plurality of first group relays, and the plurality of first group terminals are arranged in a plurality of first group sub-units,
each first group sub-unit comprising one of the first group Hi-pot conductors, one of the first group functional conductors, one of the first group relay-to-terminal conductors, one of the first group relays and one of the first group terminals,
for each first group sub-unit, the first group Hi-pot conductor in the sub-unit is directly connected to the Hi-pot conductor contact of the first group relay in the sub-unit, the first group functional conductor is directly connected to the functional contact of the first group relay in the sub-unit, the first group relay-to-terminal conductor is directly connected to the to-terminal contact of the first group relay in the sub-unit, and the first group relay-to-terminal conductor in the sub-unit is directly connected to the first group terminal,
all of the plurality of first group Hi-pot conductors are directly electrically connected to each other,
the plurality of second group Hi-pot conductors, the plurality of second group functional conductors, the plurality of second group relay-to-terminal conductors, the plurality of second group relays, and the plurality of second group terminals are arranged in a plurality of second group sub-units,
each second group sub-unit comprising one of the second group Hi-pot conductors, one of the second group functional conductors, one of the second group relay-to-terminal conductors, one of the second group relays and one of the second group terminals,
for each second group sub-unit, the second group Hi-pot conductor in the sub-unit is directly connected to the Hi-pot conductor contact of the second group relay in the sub-unit, the second group functional conductor is directly connected to the functional contact of the second group relay in the sub-unit, the second group relay-to-terminal conductor is directly connected to the to-terminal contact of the second group relay in the sub-unit, and the second group relay-to-terminal conductor in the sub-unit is directly connected to the second group terminal, and
all of the plurality of second group Hi-pot conductors are directly electrically connected to each other.

2. An integrated test fixture as recited in claim 1, wherein the integrated test fixture further comprises at least one first group neutral conductor.

3. An integrated test fixture as recited in claim 1, wherein:
the integrated test fixture further comprises at least a first power source, and
the first power source is configured to apply a voltage across (1) the plurality of first group Hi-pot conductors, and (2) the plurality of second group Hi-pot conductors.

4. An integrated test fixture as recited in any claim 1, wherein:
the integrated test fixture further comprises at least a first power source, a first group conductor and a second group conductor,
the first group conductor is directly electrically connected to each of the plurality of first group Hi-pot conductors,
the second group conductor is directly electrically connected to each of the plurality of second group Hi-pot conductors, and
the first power source is configured to apply a voltage across the first group conductor and the second group conductor.

5. An integrated test fixture as recited in claim 1, wherein:
the integrated test fixture further comprises at least a first power source and one or more functional neutral conductors,
the first power source is configured to apply a voltage across (1) the plurality of first group Hi-pot conductors, and (2) the plurality of second group Hi-pot conductors, and
at least one of the at least a first power source is configured to apply a voltage across (1) any of the plurality of first group functional conductors, and (2) any of the one or more functional neutral conductors.

6. An integrated test fixture as recited in any- claim 1, wherein:
the integrated test fixture further comprises at least a first power converter,
the power converter is configured to receive current at a first voltage and apply a second voltage across (1) the plurality of first group Hi-pot conductors, and (2) the plurality of second group Hi-pot conductors, and
the second voltage is greater than the first voltage.

7. An integrated test fixture as recited in claim 1, wherein:

for each of the first group relays in each of the first group sub-units, the default state is to electrically connect the first group Hi-pot conductor in the first group sub-unit to the relay-to-terminal conductor in the first group sub-unit, and for each of the second group relays in each of the second group sub-units, the default state is to electrically connect the second group Hi-pot conductor in the second group sub-unit to the relay-to-terminal conductor in the second group sub-unit.

8. An integrated test fixture as recited in claim 7, wherein energizing one or more of the second group relays creates electrical connection between the at least one of the second group functional conductors and at least one respective second group relay-to-terminal conductor.

9. An integrated test fixture as recited in claim 1, wherein:

the carrier is substantially rigid, all of the first group terminals and all of the second group terminals are substantially rigid and are fixedly mounted on the carrier, such that moving the carrier:

simultaneously moves all of the first group terminals and all of the second group terminals, and substantially retains a positional relationship among all of the first group terminals and all of the second group terminals.

10. A method, comprising applying a voltage across (1) the plurality of first group H-pot conductors, and (2) the plurality of second group Hi-pot conductors of an integrated test fixture as recited in claim 1, while:

a unit-under-test is in an accommodation region of the integrated test fixture, in each of the first group sub-units, the first group relay is providing electrical connection between the first group Hi-pot conductor and the first group relay-to-terminal conductor, and in each of the second group sub-units, the second group relay is providing electrical connection between the second group Hi-pot conductor and the second group relay-to-terminal conductor.

11. A method, comprising supplying current to the first group first functional conductor of an integrated test fixture as recited in claim 1, while:

a unit-under-test is in an accommodation region of the integrated test fixture, the first group first relay is not providing electrical connection between the first group first Hi-pot conductor and the first group first relay-to-terminal conductor, the first group first relay is providing electrical connection between the first group first functional conductor and the first group first relay-to-terminal conductor, the second group first relay is not providing electrical connection between the second group first Hi-pot conductor and the second group first relay-to-terminal conductor, and the second group first relay is providing electrical connection between the second group first functional conductor and the second group first relay-to-terminal conductor.

12. A method, comprising:

applying a Hi-pot voltage across (1) the plurality of first group H-pot conductors, and (2) the plurality of second group Hi-pot conductors of an integrated test fixture as recited in claim 1, while:

a unit-under-test is in an accommodation region of the integrated test fixture, in each of the first group sub-units, the first group relay is providing electrical connection between the first group Hi-pot conductor and the first group relay-to-terminal conductor, and in each of the second group sub-units, the second group relay is providing electrical connection between the second group Hi-pot conductor and the second group relay-to-terminal conductor, and supplying current to the first group first functional conductor of the integrated test fixture, while:

the unit-under-test is in the accommodation region of the integrated test fixture, the first group first relay is not providing electrical connection between the first group first Hi-pot conductor and the first group first relay-to-terminal conductor, the first group first relay is providing electrical connection between the first group first functional conductor and the first group first relay-to-terminal conductor, the second group first relay is not providing electrical connection between the second group first Hi-pot conductor and the second group first relay-to-terminal conductor, and the second group first relay is providing electrical connection between the second group first functional conductor and the second group first relay-to-terminal conductor.

13. A universal test fixture, comprising:

a processor or a non-transitory tangible medium that is configured to provide instructions to:

(1) apply a first voltage across (a) a first group conductor that is directly electrically connected to a plurality of first group Hi-pot conductors, and (b) a second group conductor that is directly electrically connected to a plurality of second group Hi-pot conductors, while not energizing any of a plurality of first group relays and not energizing any of a plurality of second group relays;

(2) while said applying said first voltage across (a) the first group conductor and (b) the second group conductor, detecting an electrical condition on any one or more of the first group conductor, the plurality of first group Hi-pot conductors, the second group conductor and the plurality of second group Hi-pot conductors;

(3) cause at least a first of said plurality of first group relays (a) to break electrical connection between a first group Hi-pot conductor and a first group relay-to-terminal conductor, and (b) to make electrical connection between a first group functional conductor and the first group relay-to-terminal conductor, (4) cause at least a first of said plurality of second group relays (a) to break electrical connection between a second group Hi-pot conductor and a second group relay-to-terminal conductor, and (b) to make electrical connection between a second group functional conductor and the second group relay-to-terminal conductor, and (5) while the first of the plurality of first group relays is making electrical connection between the first group functional conductor and the first group relay-to-terminal conductor and the first of the plurality of second group relays is making electrical connection between the second group functional conductor and the second group relay-to-terminal conductor, (a) apply a second voltage across the first group first functional conductor and a neutral conductor, to supply current through (i) the first group first functional conductor, (ii) the first group first relay, and (iii) the first group first relay-to-terminal conductor, and (b) detect an electrical condition on the second group first functional conductor, the second group first relay and/or the second group first relay-to-terminal conductor.

14. A universal test fixture as recited in claim 13, wherein said electrical condition on any one or more of the first group conductor, the plurality of first group Hi-pot conductors, the second group conductor and the plurality of second group Hi-pot conductors is whether or not a current in excess of a particular quantified value is flowing through any conductor among the plurality of first group Hi-pot conductors and the plurality of second group Hi-pot conductors.

15. A universal test fixture as recited in claim 14, wherein the quantified value is 1 milliamp.

16. A universal test fixture as recited in claim 13, wherein said electrical condition on the second group first functional conductor, the second group first relay and/or the second group first relay-to-terminal conductor is selected from among (1) whether a voltage being applied, (2) whether a voltage being applied is inside or outside a particular range or ranges, (3) a quantified value of any voltage being applied, and (4) whether a current is flowing.

17. A universal test fixture as recited in claim 13, wherein the universal test fixture further comprises one or more power cards, one or more relay cards, one or more AC current reading cards, one or more DC reading cards, and/or one or more programming cards.

18. A universal test fixture as recited in claim 13, wherein the universal test fixture further comprises at least a first programming card that is capable of communicating with a unit-under-test.

19. A universal test fixture as recited in claim 13, wherein:
   the universal text fixture further comprises at least a first power source, and
   the first power source is configured to apply a voltage across the first group conductor and the second group conductor.

20. A universal test fixture as recited in claim 13, wherein:
   the universal test fixture further comprises a power converter,
   the power converter is configured to receive current at a first voltage and apply a second voltage across the first group conductor and the second group conductor, and
   the second voltage is greater than the first voltage.

21. An integrated test system, comprising:
   a carrier,
   a plurality of first group Hi-pot conductors,
   a plurality of first group functional conductors,
   a plurality of first group relay-to-terminal conductors,
   a plurality of second group Hi-pot conductors,
   a plurality of second group functional conductors,
   a plurality of second group relay-to-terminal conductors,
   a plurality of first group relays,
   a plurality of second group relays,
   a plurality of first group terminals,
   a plurality of second group terminals,
   at least one first group neutral conductor, and
   a processor or a non-transitory tangible medium,
   all of the first group terminals and all of the second group terminals are mounted on the carrier, such that moving the carrier simultaneously moves all of the first group terminals and all of the second group terminals, each of the first group relays comprises a first group Hi-pot conductor contact, a first group functional conductor contact, and a first group to-terminal contact,
each of the second group relays comprises a second group Hi-pot conductor contact, a second group functional conductor contact, and a second group to-terminal contact,
the plurality of first group Hi-pot conductors, the plurality of first group functional conductors, the plurality of first group relay-to-terminal conductors, the plurality of first group relays, and the plurality of first group terminals are arranged in a plurality of first group sub-units,
each first group sub-unit comprising one of the first group Hi-pot conductors, one of the first group functional conductors, one of the first group relay-to-terminal conductors, one of the first group relays and one of the first group terminals,
for each first group sub-unit, the first group Hi-pot conductor in the sub-unit is directly connected to the Hi-pot conductor contact of the first group relay in the sub-unit, the first group functional conductor is directly connected to the functional contact of the first group relay in the sub-unit, the first group relay-to-terminal conductor is directly connected to the to-terminal contact of the first group relay in the sub-unit, and the first group relay-to-terminal conductor in the sub-unit is directly connected to the first group terminal,
all of the plurality of first group Hi-pot conductors are directly electrically connected to each other,
for each of the first group relays in each of the first group sub-units, the default state is to electrically connect the first group Hi-pot conductor in the first group sub-unit to the relay-to-terminal conductor in the first group sub-unit,
the plurality of second group Hi-pot conductors, the plurality of second group functional conductors, the plurality of second group relay-to-terminal conductors, the plurality of second group relays, and the plurality of second group terminals are arranged in a plurality of second group sub-units,
each second group sub-unit comprising one of the second group Hi-pot conductors, one of the second group functional conductors, one of the second group relay-to-terminal conductors, one of the second group relays and one of the second group terminals,
for each second group sub-unit, the second group Hi-pot conductor in the sub-unit is directly connected to the Hi-pot conductor contact of the second group relay in the sub-unit, the second group functional conductor is directly connected to the functional contact of the second group relay in the sub-unit, the second group relay-to-terminal conductor is directly connected to the to-terminal contact of the second group relay in the sub-unit, and the second group relay-to-terminal conductor in the sub-unit is directly connected to the second group terminal,
all of the plurality of second group Hi-pot conductors are directly electrically connected to each other,
for each of the second group relays in each of the second group sub-units, the default state is to electrically connect the second group Hi-pot conductor in the second group sub-unit to the relay-to-terminal conductor in the second group sub-unit, the processor or the non-transitory tangible medium configured to provide instructions to:

(1) apply a first voltage across (a) all of the plurality of first group Hi-pot conductors, and (b) all of the plurality of second group Hi-pot conductors, while not energizing any of the plurality of first group relays and not energizing any of the plurality of second group relays;

(2) while said applying said first voltage across all of the plurality of first group Hi-pot conductors, and all of the plurality of second group Hi-pot conductors, detecting an electrical condition on any one or more of the plurality of first group Hi-pot conductors, any other conductor that is directly electrically connected to any of the plurality of first group Hi-pot conductors, the plurality of second group Hi-pot conductors, and any other conductor that is directly electrically connected to any of the plurality of second group Hi-pot conductors;

(3) cause at least a first of said plurality of first group relays (a) to break electrical connection between a first group Hi-pot conductor and a first group relay-to-terminal conductor, and (b) to make electrical connection between a first group functional conductor and the first group relay-to-terminal conductor, (4) cause at least a first of said plurality of second group relays (a) to break electrical connection between a second group Hi-pot conductor and a second group relay-to-terminal conductor, and (b) to make electrical connection between a second group functional conductor and the second group relay-to-terminal conductor, and (5) while the first of the plurality of first group relays is making electrical connection between the first group functional conductor and the first group relayto-terminal conductor and the first of the plurality of second group relays is making electrical connection between the second group functional conductor and the second group relay-to-terminal conductor, (a) apply a second voltage across the first group first functional conductor and a neutral conductor, to supply current through (i) the first group first functional conductor, (ii) the first group first relay, and (iii) the first group first relay-to-terminal conductor, and (b) detect an electrical condition on the second group first functional conductor, the second group first relay and/or the second group first relay-to-terminal conductor.

22. An integrated test system as recited in claim 21, wherein:

the integrated test system further comprises at least a first power source, and the first power source is configured to apply a voltage across (1) the plurality of first group Hi-pot conductors, and (2) the plurality of second group Hi-pot conductors.

23. An integrated test system as recited in claim 21, wherein:

the integrated test system further comprises at least a first power source, a first group conductor and a second group conductor, the first group conductor is directly electrically connected to each of the plurality of first group Hi-pot conductors, the second group conductor is directly electrically connected to each of the plurality of second group Hi-pot conductors, and the first power source is configured to apply a voltage across the first group conductor and the second group conductor.

* * * * *